United States Patent [19]

Ino et al.

[11] Patent Number: 5,452,204
[45] Date of Patent: Sep. 19, 1995

[54] HIGH SPEED IMAGE CONSTRUCTING UNIT FOR A MAGNETIC RESONANCE IMAGING SYSTEM

[75] Inventors: Mitsutoshi Ino; Shiro Nakatao, both of Kawasaki, Japan

[73] Assignee: Fuji Electric Co., Ltd., Kawasaki, Japan

[21] Appl. No.: 891,846

[22] Filed: May 29, 1992

[30] Foreign Application Priority Data

May 30, 1991 [JP] Japan .................................. 3-155861

[51] Int. Cl.⁶ ............................................ A61B 5/055
[52] U.S. Cl. .................................. 364/413.13; 324/307
[58] Field of Search .................... 364/413.13; 324/307, 324/309, 312; 128/653.1; 395/163, 164

[56] References Cited

U.S. PATENT DOCUMENTS

| | | | |
|---|---|---|---|
| 4,709,332 | 11/1987 | Morrison et al. | 364/413.13 |
| 5,089,777 | 2/1992 | Iino et al. | 324/309 |
| 5,099,208 | 3/1992 | Fitzpatrick et al. | 324/312 |
| 5,144,242 | 9/1992 | Zeilenga et al. | 324/312 |
| 5,275,164 | 1/1994 | Maeda et al. | 128/635.2 |
| 5,287,436 | 2/1994 | Fischer et al. | 395/119 |

*Primary Examiner*—David M. Huntley
*Assistant Examiner*—A. Bodendorf
*Attorney, Agent, or Firm*—Greer, Burns & Crain, Ltd.

[57] ABSTRACT

An image reconstructing operation unit reconstructs an image by a two- or three-dimensional Fourier transform. The unit comprises a plurality of operating mechanisms for performing an operation to reconstruct an image, a plurality of local memory mechanisms, provided correspondingly to the operating mechanisms, provided correspondingly to the operating mechanisms, for storing data used in the operations and the operation results, a shared memory mechanism for storing data after the first- and second-dimension processes and the first-, second-, and third-dimension processes, a data transmission mechanism for transmitting data between the local memory mechanism and the shared memory mechanism, and an instruction control mechanism for controlling the operation of each mechanism and its timing. Operations performed by the operating mechanisms in the first-, second-, and third-dimension data processes are carried out in parallel with the data transmission between the local memory mechanism and the shared memory mechanism. Thus, images can be reconstructed at a high speed by an NMR imaging device.

14 Claims, 30 Drawing Sheets

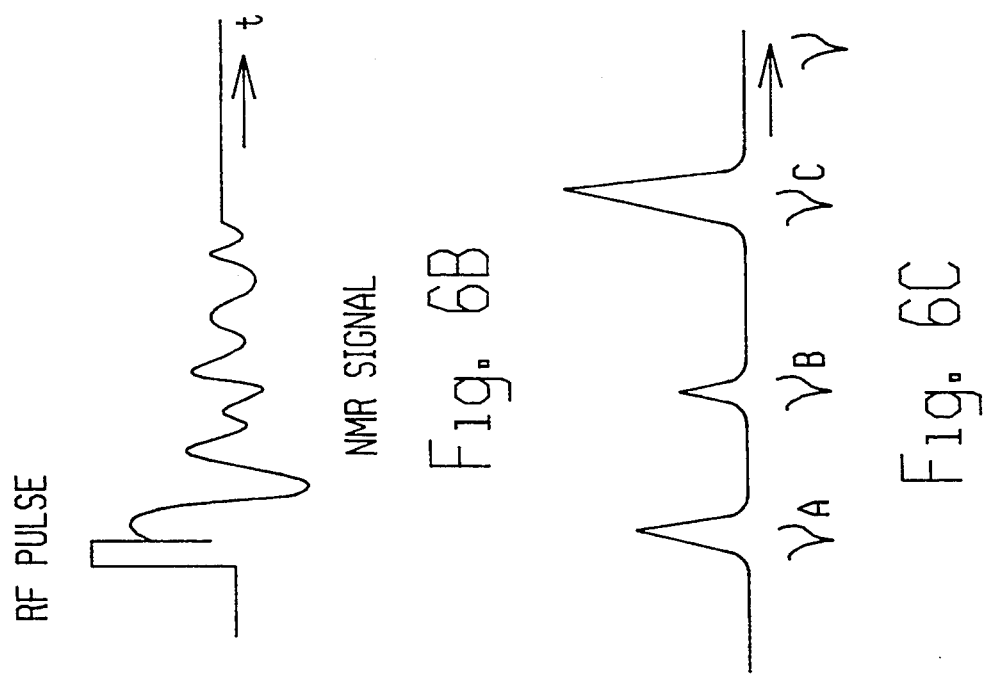
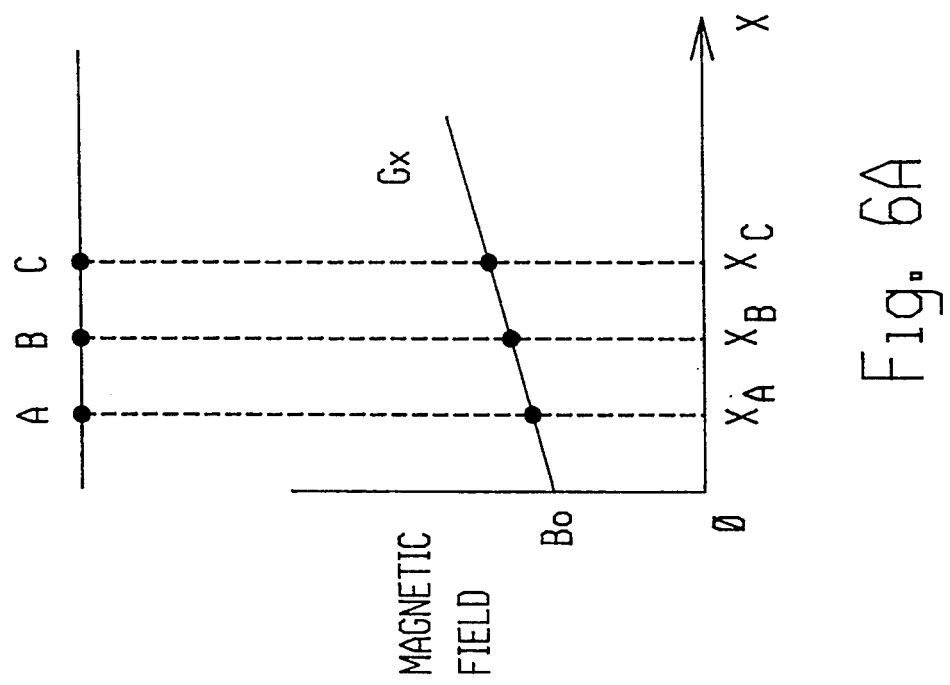

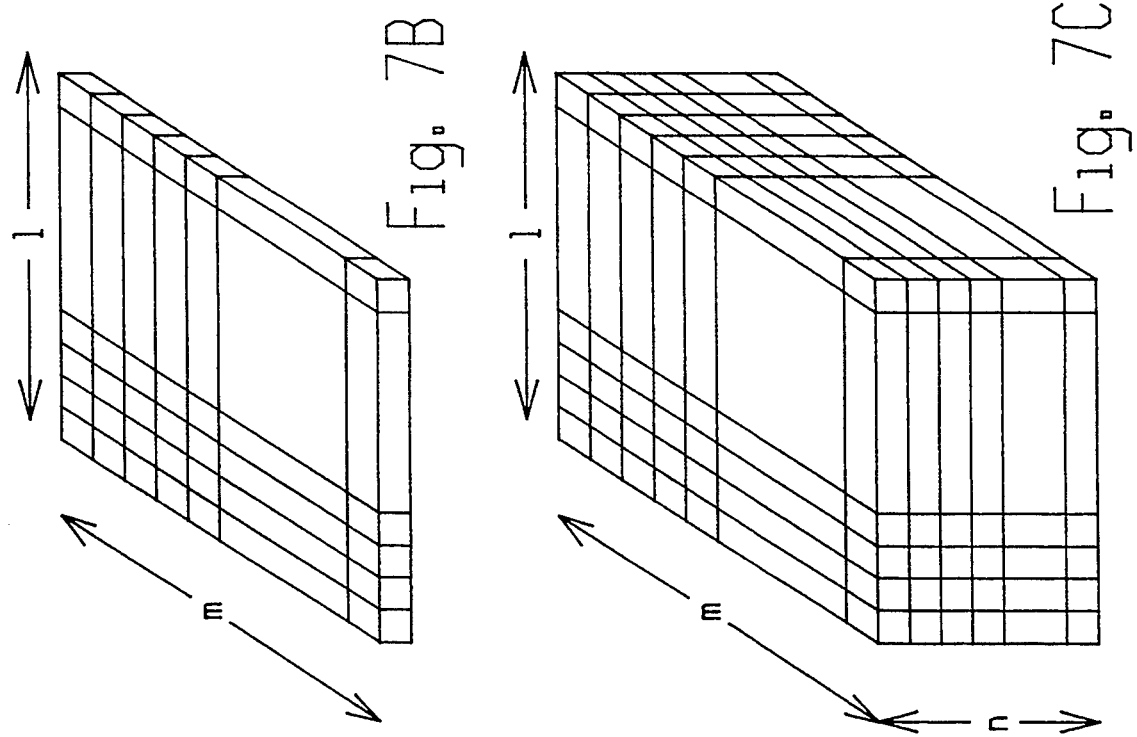
Fig. 7B
Fig. 7C
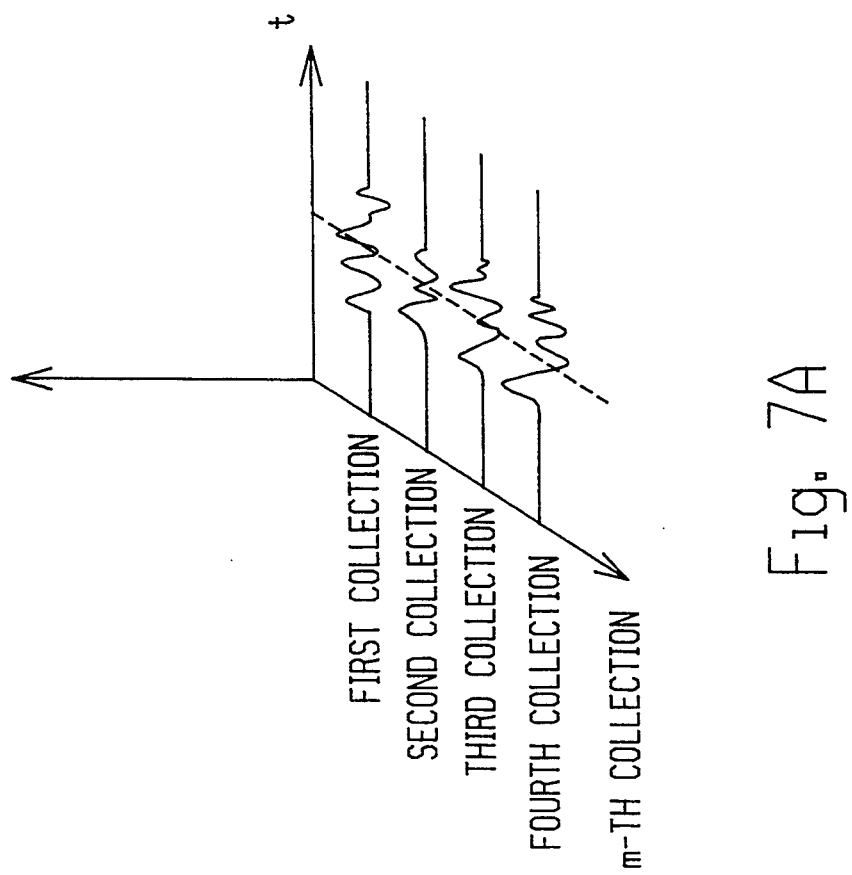
Fig. 7A

HIGH SPEED IMAGE CONSTRUCTING UNIT FOR A MAGNETIC RESONANCE IMAGING SYSTEM

BACKGROUND OF THE INVENTION

The present invention relates to high speed image constructing unit for a nuclear magnetic resonance imaging system and performs an image construct operation using two-dimensional or three-dimensional Fourier transformation methods.

A nuclear magnetic resonance imaging process is performed to obtain an image of a section, etc. of an object as follows. When an atomic nucleus (a hydrogen atomic nucleus, etc.) is put in an even static magnetic field, the spin of the atomic nucleus starts precessing around the static magnetic field. Then, a radiofrequency pulse (an RF pulse) having a frequency equal to that of the precession is applied to the object to induce nuclear magnetic resonance phenomena, thereby generating signals which can be used to form a target image. In the Fourier transformation method, each atomic nucleus in an object is made to repeat resonance and relaxation at a different frequency depending on the magnitude of the magnetic field by superposing in the static magnetic field an oblique magnetic field whose magnitude is variable in the specific direction. Thus, the resultant signal is processed by the Fourier transformation to analyze the frequency and construct an image.

In reference to the Fourier transformation method, there is a Fourier transformation Zeugmatography method (the original method) as a well-known example (refer to Kumar. A, Welti. D, and Ernst. R, "NMR Fourier Zeugmatography", J.Magn,Reson., 18, p.69 (1975)).

Another prior art technology is a Spin Warp Method (refer to Edelstein, W. A., Hutchison, J. M. S., Johnson, G & Redpath, T. W. "Spin Warp NMR Imaging and Applications to Human Whole-Body Imaging" Phys. Med. Biol, 25, P751 (1980)). In this technology, a field echo method is used as a mechanism for generating an echo.

FIG. 1 shows a block diagram of a common nuclear magnetic resonance imaging system to which the above described method is applied.

That is, a test object 1 is put in a static magnetic field coil 2 for generating an even static magnetic field. A computer system 11 comprises a pulse sequencer 13, a CPU 14, a hard disk 15, a console 16, a digital input interface 17, and an image construct operating unit 18, etc. They are connected to one another through a system bus 12.

When the console issues a pickup instruction, the CPU 14 activates the pulse sequencer 13. The pulse sequencer 13 controls at predetermined timing, an oblique magnetic field power source 5, 6, 7 (oblique magnetic fields Gx, Gy, and Gz are induced in the directions X, Y, and Z respectively), and an RF transmission system 8. Therefore, an oblique magnetic field coil 3 and an RF coil 4 generate a predetermined oblique magnetic field and a radiofrequency magnetic field respectively. Consequently, the test object 1 generates an NMR (nuclear nuclear magnetic resonance) signal. After being received by the RF coil 4, the NMR signal is tested and amplified by an RF receiving system 9. Then, it is transformed to a digital signal by an A/D converter 10, and is read into the computer system 11 through the digital input interface 17. The read data are sent to the image construct operating unit 18 and processed by an image constructing operation. Then, they are displayed as an image on the console 16. In FIG. 1, 12 is a system bus, and 15 is a hard disk for storing images.

FIG. 2 shows an example of data collecting timing applied to the two-dimensional Fourier transformation. The figure shows each output of the RF magnetic field, the oblique magnetic fields Gz, Gx, and Gy, and the operation of the NMR signal and the A/D converter 10.

In FIG. 2, 201 is a 90° RF pulse; 202 is an oblique magnetic field for selecting a slice; 203 is an oblique magnetic field for encoding a frequency; and 204 is an oblique magnetic field for encoding a phase. When an image is obtained in an L×M matrix, an NMR signal 205 is sampled for L points (206) by the A/D converter 10.

The above processes for 201–206 are operated M times at the repetition time $T_R$ intervals with the phase encoding oblique magnetic field changed each time. Thus obtained L×M point data are processed into two-dimensional image data by the image construct operating unit 18 through an image regenerating operation including the two-dimensional Fourier transformation.

FIG. 3 is an example of the image construct operating unit 18. Since numbers 1–17 refer to the same parts as those referred to by the same numbers in FIG. 1, the explanation is omitted here.

In FIG. 3, a host interface mechanism 181 is provided in the image construct operating unit 18; an instruction control mechanism 182 controls each mechanism in the image construct operating unit 18 according to an instruction from the host computer; a data memory mechanism 183 stores data; and an operating mechanism 184 performs an operation necessary for constructing an image. Each of the mechanisms is connected through a local bus 185, and connected to the system bus 12 through the host interface mechanism 181.

The NMR signal (raw data) collected by the A/D converter 10 at the timing 206 shown in FIG. 2 are accumulated in the data memory mechanism 183 through the digital input interface 17, the system bus 12, and the host interface mechanism 181. With the image construct operating unit used for the nuclear magnetic resonance imaging system, the two-dimensional Fourier transformation method is applied in which the first-dimension data process is performed immediately after or in parallel with each data collection, and the second-dimension data process is performed after all the data are collected. The first-dimension data process is performed on the raw data accumulated in the data memory mechanism 183 by the operating mechanism 184 immediately after each data collection.

After data is processed by the first-dimension data process (intermediate data), they are stored again in the data memory mechanism 183. Thus, after all the data collections are completed and the first-dimension data process of all the data is completed, the operating mechanism 184 performs the second-dimension data process on the intermediate data accumulated in the data memory mechanism 183, generates image data, and accumulates them in the data memory mechanism 183. The accumulated image data are transmitted to the console 16 through the host interface mechanism 181 and the system bus 12, and then displayed thereon.

FIG. 4 shows an example of common data collecting timing applied to the three-dimensional Fourier transformation method.

Like in FIG. 2, FIG. 4 shows each output of the RF magnetic field, the oblique magnetic fields Gz, Gx, and Gy, and the operation of the NMR signal and the A/D converter 10. 301 in FIG. 4 is a 90° RF pulse; an oblique magnetic field 302 encodes a phase in the direction of the Z axis; an oblique magnetic field 303 encodes a frequency; and an oblique magnetic field 304 encodes a phase in the direction of the Y axis.

When an image data is obtained in an L×M×N matrix, an NMR signal 305 is sampled for L points (306) by the A/D converter 10. The above processes for 301–306 are operated M times at the repetition time $T_R$ intervals with the phase encoding oblique magnetic field 304 in the direction of the Y axis changed each time. Then, the M-time processes are repeated N times with the phase encoding oblique magnetic field 302 in the direction of the Z axis changed each time. Thus obtained L×M×N point data are processed into three-dimensional image data by the image construct operating unit 18 through an image constructing operation including the three-dimensional Fourier transformation.

FIG. 5 shows an example of an image construct operating unit used for the nuclear magnetic resonance imaging system in which the three-dimensional Fourier transformation method is applied. In this method, the first-dimension data process is performed immediately after or in parallel with each data collection, the second-dimension data process is performed immediately after a predetermined number of repetition of data collections or in parallel with the data collections and the first- and second-dimension processes are performed in parallel, and the third- dimension data process is performed after all the data are collected. In FIG. 5, numbers 1–18, and 181–185 refer to the same parts as those referred to by the same numbers shown in FIG. 3.

The number 19 in FIG. 5 refers to another image construct operating unit having the same configuration as the image construct operating unit 18. Numbers 191–195 refer to the same elements as the numbers 181–185.

The NMR signal (raw data) collected by the A/D converter 10 at the timing 306 shown in FIG. 4 are accumulated in the data memory mechanism 183 through the digital input interface 17, the system bus 12, and the host interface mechanism 181 in the image construct operating unit 18. The first-dimension data process is performed on the accumulated raw data by the operating mechanism 184 immediately after each data collection. The first-dimension data process outputs intermediate data which are temporarily stored in the data memory mechanism 183, and then accumulated in the data memory mechanism 193 through the host interface mechanism 181, the system bus 12, and the host interface mechanism 191 in the image construct operating unit 19.

After completing M repetition of the L-point data collections and the first-dimension data processes by the image construct operating unit 18, and after storing in the data memory mechanism 193 the intermediate L×M-point data necessary for the second-dimension data process, the operating mechanism 194 performs the second-dimension data process on the intermediate data accumulated in the data memory mechanism 193, and stores the processed data again in the data memory mechanism 193. During these processes, the image construct operating unit 18 continuously performs the first-dimension data process. Thus, the first- and the second-dimension data processes are performed in parallel with the data collections.

After completing all the data collections, and the first- and the second-dimension data processes on all the data, the operating units 194 perform the third-dimension data process on the data accumulated in the data memory mechanism 193, generate image data, and accumulate them in the data memory mechanism 193. The accumulated data are transmitted to the console 16 through the host interface mechanism 191 and the system bus 12, and then displayed thereon.

With the above described image construct operating unit used for the nuclear magnetic resonance imaging system in which the two-dimensional Fourier transformation system is applied, the first- and the second-dimension data processes are separately performed by only one operating unit, and the data must be transmitted before and after the data processing operations. Therefore, too much time is taken for the image construct.

Besides, with the image construct operating unit used for the nuclear magnetic resonance imaging system to which the three-dimensional Fourier transformation method is used, the first-, second-, and third-dimention data processes are separately performed by only one operating unit, and the data must be transmitted before and after the data are processed like in the two-dimensional-Fourier transformation method. Therefore, too much time is taken for the image construct.

SUMMARY OF THE INVENTION

The present invention has been developed to solve the above described problems. An object of the present invention is to provide an image construct operating unit for a nuclear magnetic resonance imaging system capable of performing a high-speed operation by constructing an image in a short time.

To attain the above described object, the first principle of the present invention is configured to apply to an image construct operating unit used for a nuclear magnetic resonance imaging system for performing an image constructing operation based on the two-dimensional Fourier transformation method. It comprises a plurality of operating mechanisms for performing operations for constructing an image, a plurality of sets of local memory mechanisms corresponding to the operating mechanisms and which store data used for the above described operations and the resultant data, a shared memory mechanism for storing data for which transformation is complete, a data transmission mechanism for transmitting data between the local memory mechanism and the shared memory mechanism, and an instruction control mechanism for controlling the operation and timing of each of the above listed mechanisms. The first principle of the present invention performs each operation by the operating mechanism in the first- and the second-dimension data processes in parallel with the data transmission between the local memory mechanism and the shared memory mechanism.

The second principle of the present invention is configured to apply to an image construct operating unit used for a nuclear magnetic resonance imaging system for performing an image constructing operation based on the three-dimensional Fourier transformation method. It comprises a plurality of operating mechanisms for performing an operation for constructing an image, a plurality of sets of local memory mechanisms corresponding to the operating mechanisms and which store data used for the above described operations and the resultant data, a shared memory mechanism for storing data outputted by the first-, the second-, and the third-dimension processes for which transformation is complete, a data transmission mechanism for transmitting data between the local memory mechanism and the shared memory mechanism, and an instruction control mechanism for controlling the operation and timing of each of the above listed mechanisms. The second principle of the present invention performs each operation by the operating mechanism in the first-, the second-, and the third-dimension data processes in parallel with the data transmission between the local memory mechanism and the shared memory mechanism.

Each of the local memory mechanisms in the first and the second principles further comprises halved local memory banks and a connection path switchover mechanism for switching to and from a connection path between the local memory banks and the operating mechanisms and to a connection path between the local memory banks and the shared memory mechanism. The connection path switchover mechanism switches to either of the connection paths as necessary to concurrently perform the read/write of data by the operating mechanisms and the read/write of data by the data transmission mechanism.

In the first principle, the image construct operating system comprises at least two sets of an operating mechanism, a connection path switchover mechanism, and a local memory mechanism having two memory banks. In the second principle, the image construct operating system comprises at least four sets of them.

In each of the first-, the second-, and the third-dimension data processes in the first or the second principle, one operating mechanism accesses only one local memory mechanism connected to it during a read/write of data in an operation in order to perform an operation using data stored in the local memory mechanism connected to it. If a plurality of operating mechanisms and local memory mechanisms are provided, each of them can concurrently perform a plurality of operations. The shared memory mechanism stores all data to be processed, and the data transmission mechanism performs two-way data transmission between the shared memory mechanism and each of the local memory mechanisms to execute an operation by an operating mechanism.

One of the two local memory banks in the local memory mechanism is connected to an operating mechanism and the other is connected to the shared memory mechanism through the connection paths. While the operating mechanism is reading/writing data stored in one local memory bank connected to it to perform an operation, data are read/written by the data transmission mechanism between the shared memory mechanism and the other local memory bank connected to the shared memory mechanism.

When the connection path switchover mechanism switches the connection between two local memory banks and the operating unit or the shared memory mechanism after one operation is completed by the operating mechanism, one local memory bank connected to the operating mechanism is connected to the shared memory mechanism and the other local memory bank connected to the shared memory mechanism is connected to the operating mechanism. Then, another operation and data transmission is performed using respective local memory bank.

Thus, a read/write of data to the local memory by the operating mechanism is performed in parallel with a read/write of data by the data transmission mechanism. An operation by the operating mechanism, a data transmission by the data transmitting mechanism, and a switchover of the local memory bank connection path by the connection path switchover mechanism are controlled by the instruction control mechanism.

With this configuration, an image construct operating process based on the two-dimensional or three-dimensional Fourier transformation can be performed in a half (when two sets are provided) or a quarter (when four sets are provided) of the time taken by the original configuration.

BRIEF DESCRIPTION OF THE DRAWINGS

Other objects and features of the present invention can be easily recognized by referring to the attached drawings and the description of the preferred embodiment.

FIG. 6 is a simplified conceptual view for explaining the nuclear magnetic resonance imaging method;

FIG. 7 is a view for explaining the construct of an image by collecting data and performing Fourier transformation on the data;

DESCRIPTION OF THE PREFERRED EMBODIMENT

Figure 1:
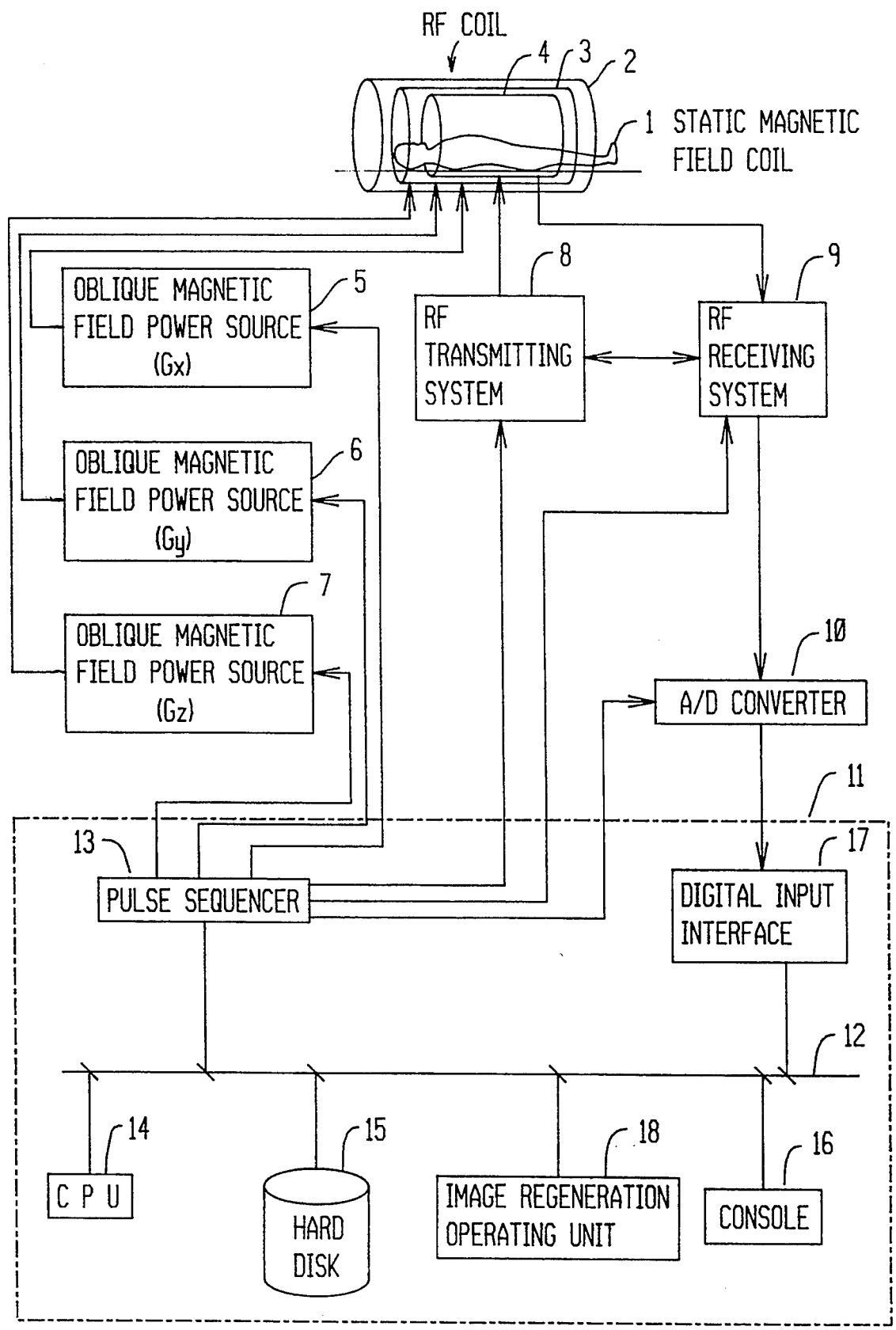
FIG. 1 is a block diagram of a conventional nuclear magnetic resonance imaging system.

The NMR imaging method is disclosed in two prior art technologies. However, a simplified conceptual explanation is described below.

Nuclear magnetic resonance is a phenomenon in which a degenerated energy level is split when an atom whose nucleus has spin is put in an even magnetic field, thereby causing the absorption of the energy of an irradiating magnetic wave at a resonance frequency, followed by the re-emission of the magnetic wave. This phenomenon is utilized in the NMR imaging method to generate an image from an NMR signal of, for example, a hydrogen atomic nuclear in an organism.

A spin is a small magnetic vector which starts precessing around a static magnetic field when it is put into the field. The frequency of the precession is the resonance frequency of an NMR. Electric current is generated when a magnetic object moves. For example, if a static magnetic field is applied in a specific direction and a magnetic vector is detected along the plane perpendicular to the direction, electric current is generated through a coil placed on the plane by the above described precession. An NMR signal is thus generated.

The condition of the resonance of an NMR is determined by $\nu = \gamma Bo/2\pi$, where $\nu$ indicates a resonance frequency, $\gamma$ indicates a magnetogyric ratio, and Bo indicates the intensity of the static magnetic field. Therefore, if an atomic nucleus is detected, the resonance frequency varies strictly in proportion to an external magnetic field. Therefore, if an identifiable change is applied somehow to a magnetic field, wherein a test object is put, exact position information can be obtained by measuring the resonance frequency.

In FIG. 6A, an organism has three points A, B, and C as objective resonance nuclei, and a linear magnetic field gradient Gx is given in the direction indicated by the line connecting the three points above (for example, the x direction). If each of the relative positions of these three points in the x direction is $X_A$, $X_B$, and $X_C$, the resonance frequencies $\nu_A, \nu_B,$ and $\nu_C$ are obtained as follows.

$$\nu_A = \gamma (Bo + GxX_A)/2\pi$$

$$\nu_B = \gamma (Bo + GxX_B)/2\pi$$

$$\nu_C = \gamma (Bo + GxX_C)/2\pi$$

Thus, A, B, and C resonate at different frequencies.

On such conditions, the time-series variation of the signal pattern can be indicated by a signal generated by the interference of $\nu_A, \nu_B,$ and $\nu_C$ as shown in FIG. 6B. Then, a spectrum over the range of frequencies is obtained as shown in FIG. 6C if the Fourier transformation is performed on the NMR signal. If the degree of the applied linear magnetic field gradient is known, position information can be obtained from the resonance frequency. The spin density of an atomic nucleus at each position is determined by the amplitude of each corresponding frequency (intensity of a spectrum).

In the two-dimensional Fourier transformation, a plane (x,y) is specified in the linear magnetic field gradient in the direction of the z axis, for example. Then, a predetermined gradient magnetic field Gx is applied in the direction of the x axis, and a gradient magnetic field Gy is applied for a phase encoding in the direction of the y axis. Data of a matrix $1 \times m$ are collected as shown in FIG. 7B by repeating m times, pursuant to varies of Gy strength, the data collection for 1 points at a time as shown in FIG. 7A. First, the Fourier transformation is performed on the collected data in the direction of the x axis in 1 point data units to divide the data in the direction of the x axis. Then, the Fourier transformation is performed on the collected data in the direction of the y axis in m point data units to divide the data in the direction of the y axis. Thus, the $1 \times m$ points can be constructed on the plane $(\nu x, \nu y)$ represented by the transformed resonance frequency. Since (Gx, Gy) is known, the frequency corresponds to each position, and a two-dimensional image can be constructed.

The three-dimensional Fourier transformation is an extension of the above described two-dimensional Fourier transformation. For example, a pair of coordinates based on three coordinate axes representing a solid object are determined by applying a gradient magnetic field. The other two pairs of coordinates are determined by a phase encoding. The plane data of the first plane of the matrix $1 \times m$ in the solid object are collected by repeating m times the. data collection for 1 points at a time as shown in FIG. 7A. Then, the plane data collection for the second plane, third plane, . . . , and the n-th plane are carried out to obtain $1 \times m \times n$ pieces of data as shown in FIG. 7C. After performing the two-dimensional Fourier transformation for each plane data, the Fourier transformation is carried out in the direction of the z axis in n point data units. Thus, $1 \times m \times n$ points can be constructed in the space of the transformed resonance frequency $(\nu x, \nu y, \nu z)$, thereby constructing a three-dimensional image.

Figure 8:
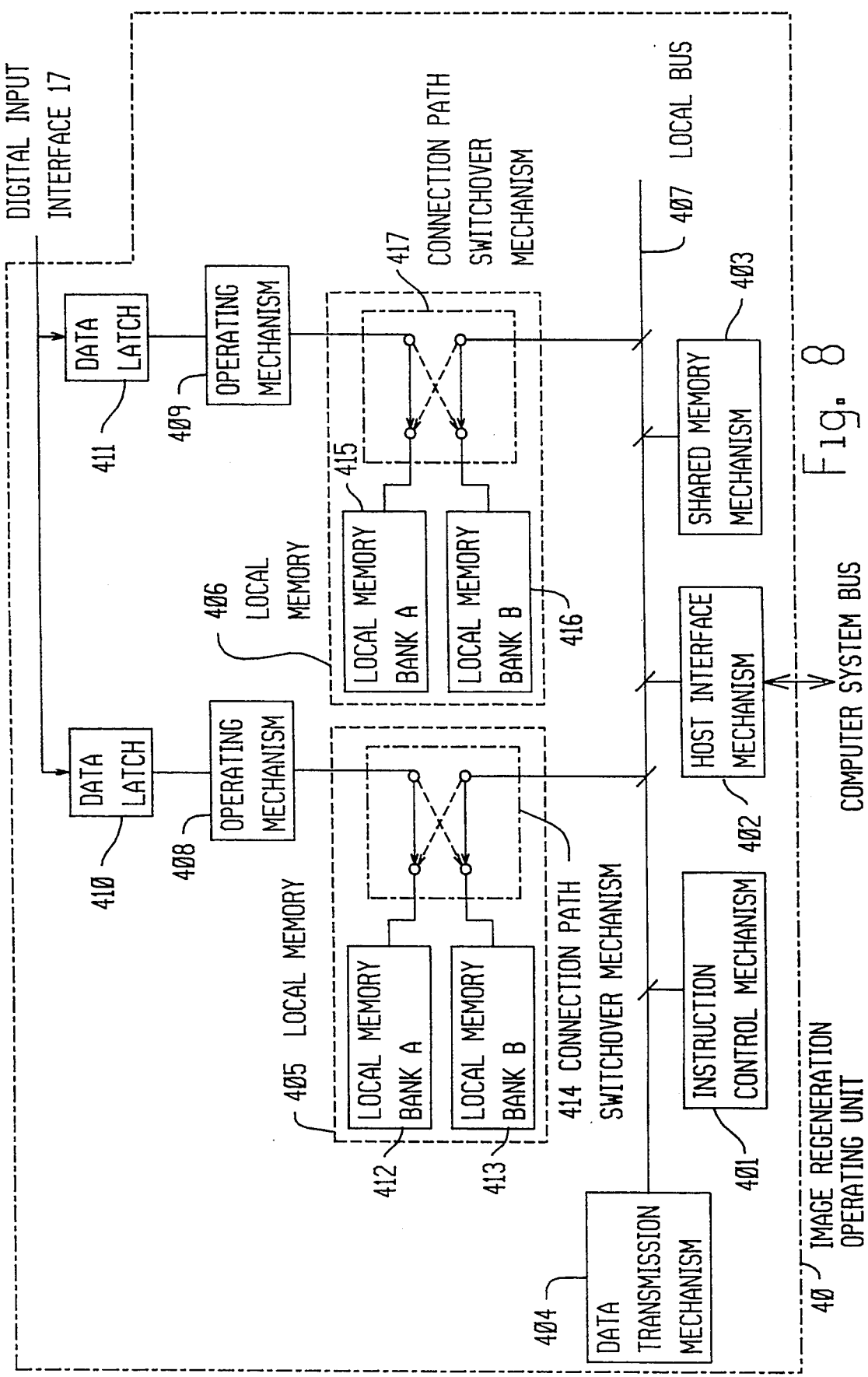
FIG. 8 shows the configuration of the important part of an embodiment of the first principle.
Figure 9:
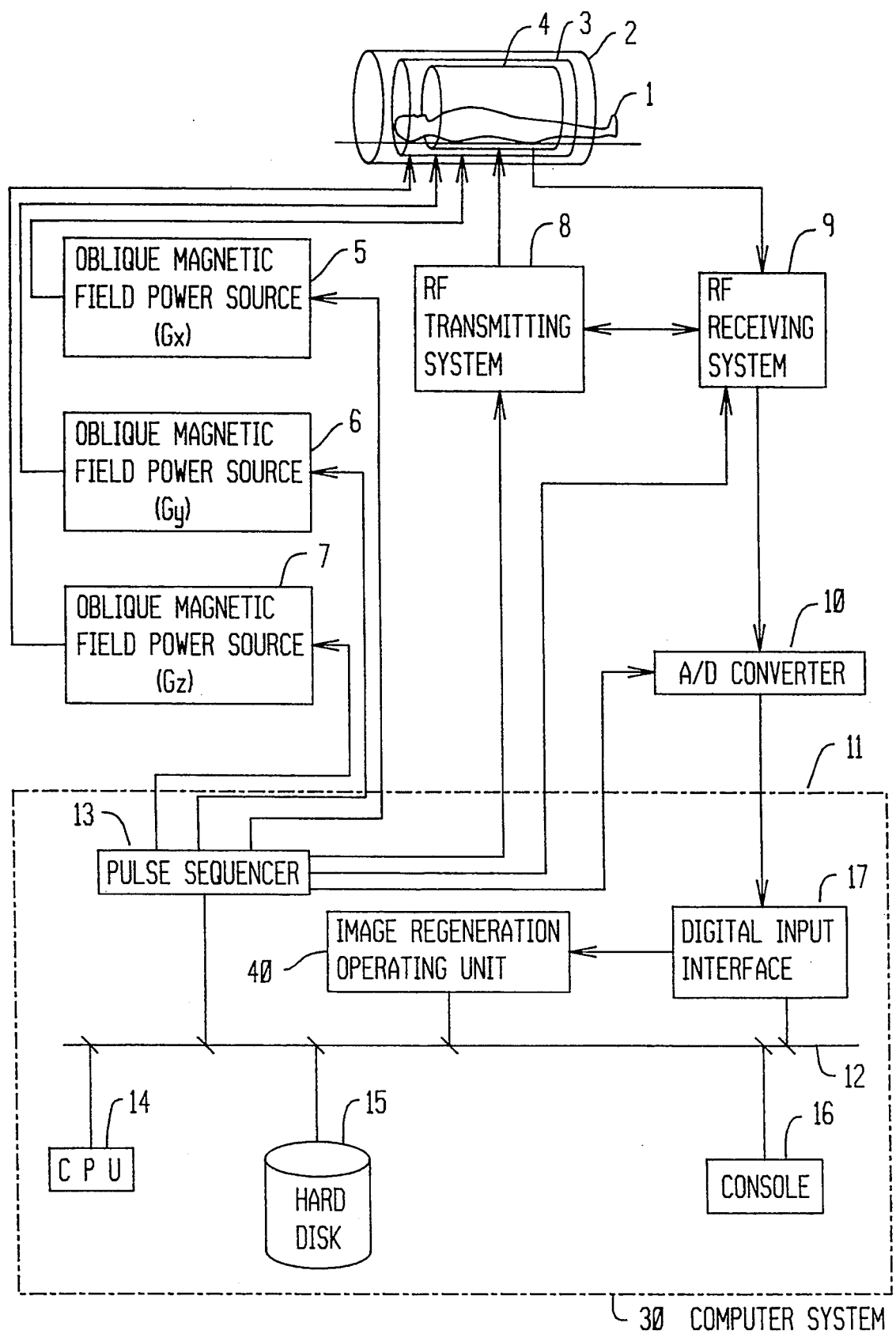
FIG. 9 is a block diagram of the nuclear magnetic resonance imaging system to which the embodiment shown in FIG. 8 is applied.

An embodiment of the present invention is described by referring to the attached drawings. FIG. 8 shows an embodiment of the image construct operating unit used with the two-dimensional Fourier transformation method as the first principle of the present invention. FIG. 9 shows the configuration of the nuclear magnetic resonance imaging system according to the embodiment.

In an image construct operating unit 40 shown in FIG. 8, 401 is an instruction control mechanism, 402 is a host interface mechanism, 403 is a shared memory mechanism, 404 is a data transmission mechanism, 405 is a first local memory mechanism, 406 is a second local memory mechanism, 407 is a local bus, 408 is a first operating mechanism, 409 is a second operating mechanism, 410 and 411 are data latches connected to the digital input interface 17 (refer to FIG. 9), 412 and 413 are local memory banks A and B in the first local memory mechanism 405, 414 is a connection path switchover mechanism in the first local memory mechanism 405, 415 and 416 are local memory banks A and B in the second local memory mechanism 406, and 417 is a connection path switchover mechanism in the second local memory mechanism 406. FIG. 8 shows an embodiment comprising the two operating mechanisms 408 and 409 and the local memory mechanisms 405 and 406. It is obvious that there can be a larger number of operating mechanisms and local memory mechanisms.

Next, in FIG. 9, since numbers 1–17 refer to the same parts as those referred to in FIG. 1, the explanation on them are omitted here. In this embodiment, data are directly transmitted from the digital input interface 17 to the image construct operating unit 40. However, they can be transmitted to the image construct operating unit 40 through the system bus 12 to perform the same operation.

The operation of the preferred embodiment shown in FIGS. 8 and 9 is described below.

Figure 2:
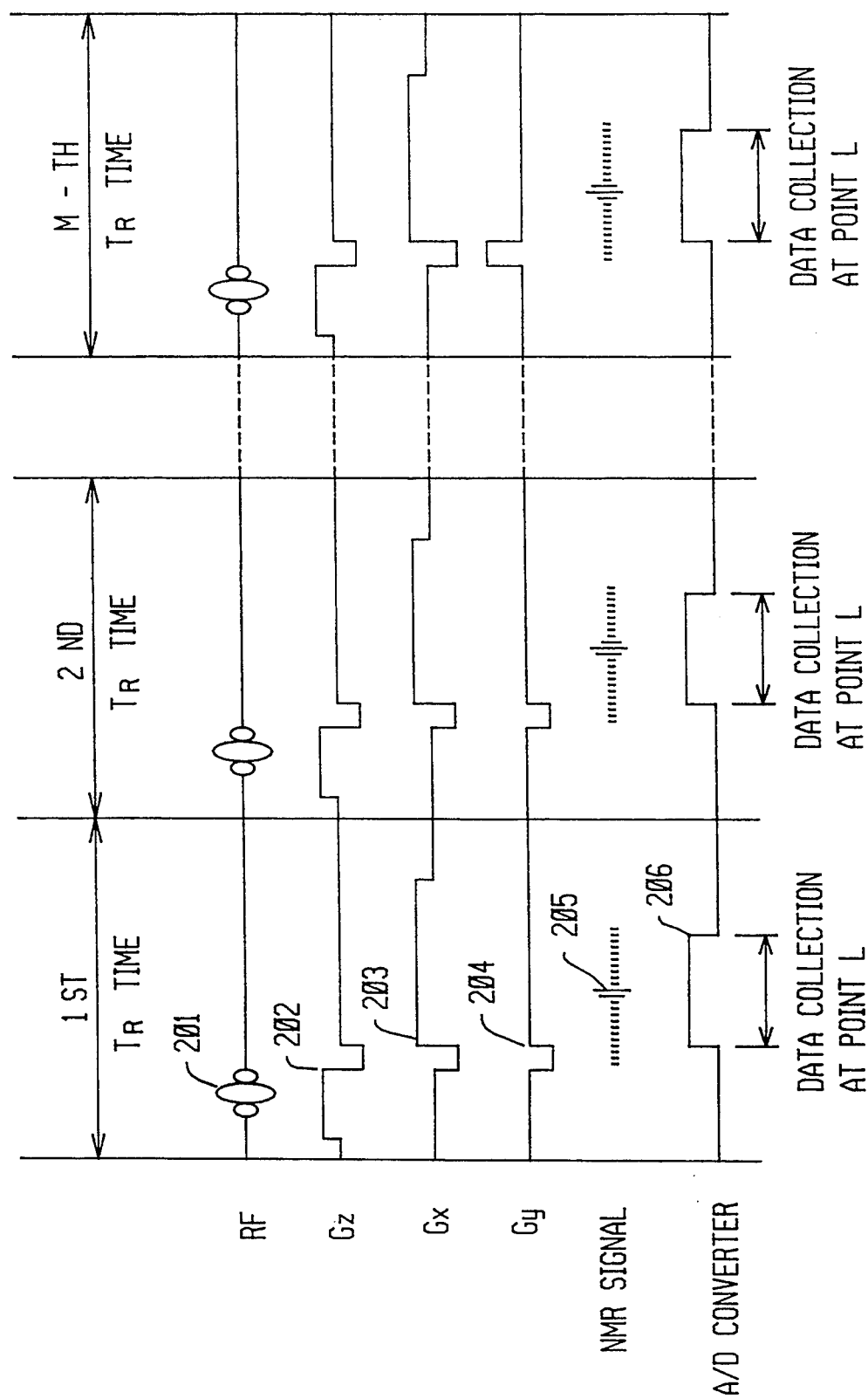
FIG. 2 is a block diagram for explaining the data collection timing when the two-dimensional Fourier transformation method is applied.
Figure 3:
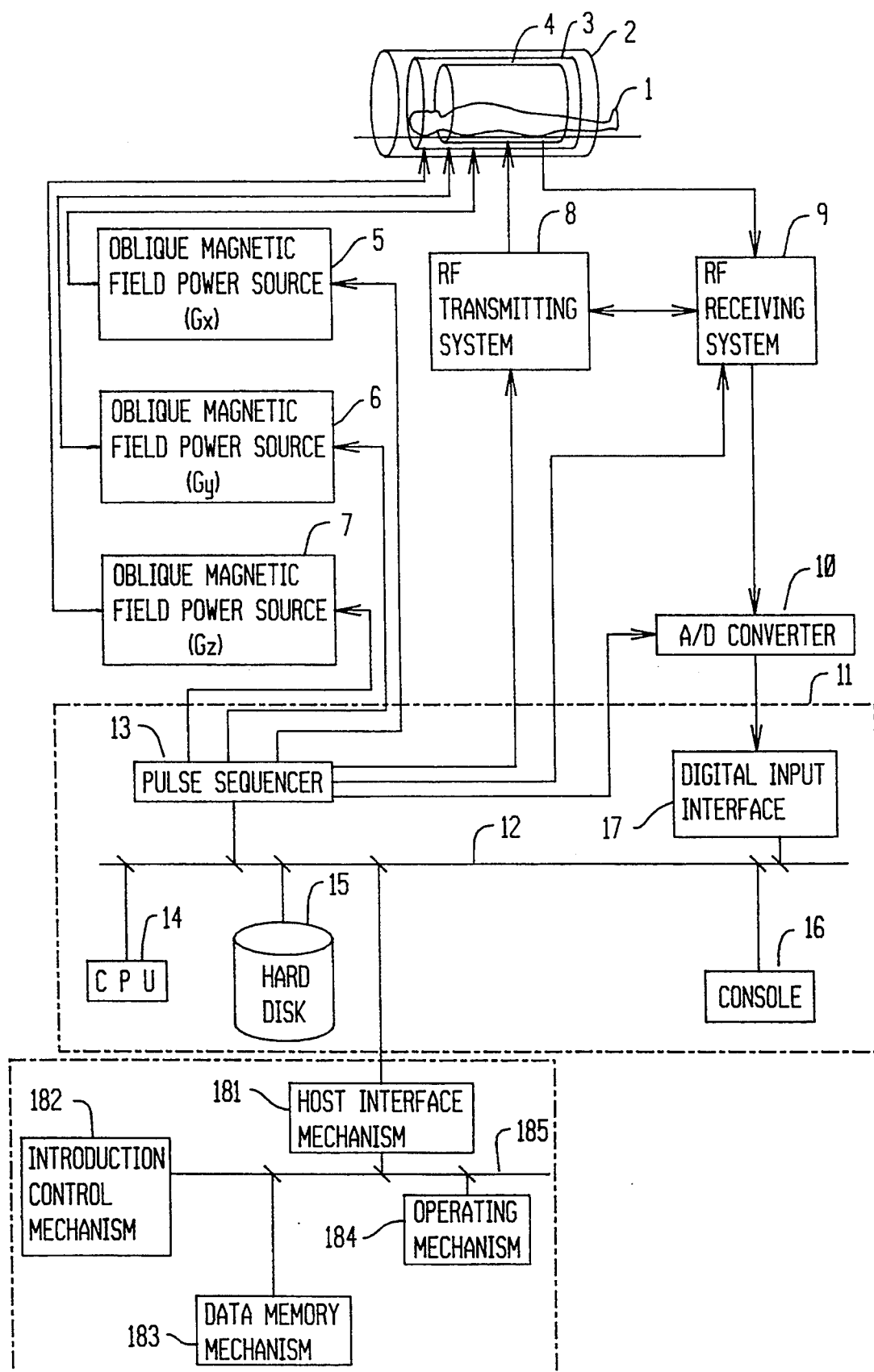
FIG. 3 shows the configuration of the conventional image construct operating unit in which the two-dimensional Fourier transformation method is applied.
Figure 10:
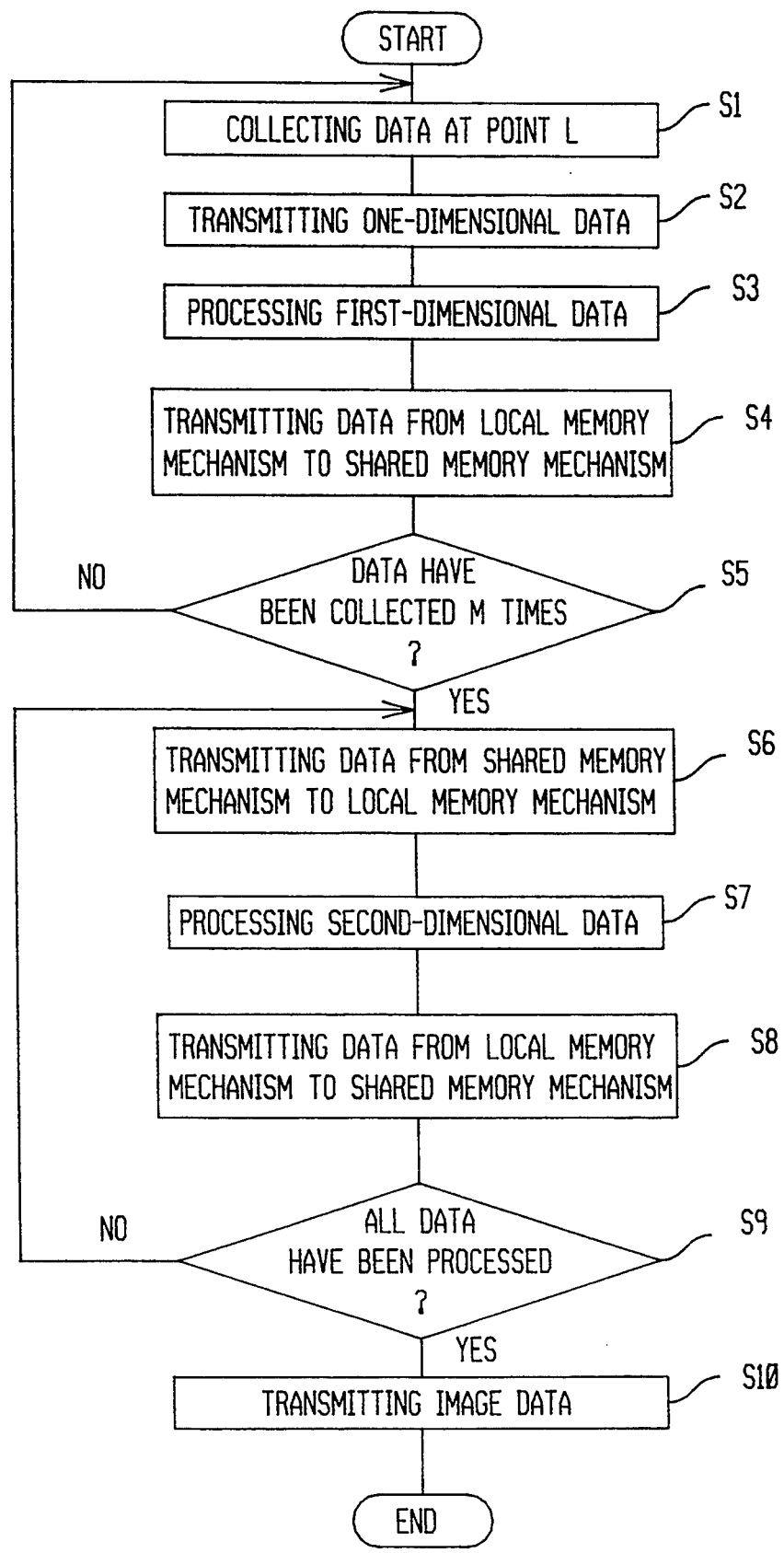
FIG. 10 is a general flowchart of the image construct operating process executed in the two-dimensional Fourier transformation method.

FIG. 10 is a general flowchart for explaining the image construct operating process in which data are collected at the data collecting timing shown in FIG. 2, and an L×M matrix image is obtained according to the two-dimensional Fourier transformation method.

When the two-dimensional Fourier transformation method is applied, the first-dimension data processes (including the process for signals of a digital filter, a direct current component correction, and a phase correction, etc., and for the one-dimensional complex FFT, etc.) are performed in parallel with the data collections. The collected L-point data are transmitted from the digital-input interface 17 to the first operating mechanism 408 in the image constructing operation unit 40 through the data latch 410. The first operating mechanism 408 performs an operation necessary for the first-dimension data process using the memory in the local memory mechanism 405 to write the operation result to the local memory mechanism 405 (S1–S3 in FIG. 10).

Then, the connection path switchover mechanism 414 in the local memory mechanism 405 is set such that the local memory bank A 412 is connected to the operating mechanism 408 and the local memory bank B 413 is connected to the local bus 407. When the first-dimension data processing operation is completed by the first operating mechanism 408 and immediately after the operation result is accumulated in the local memory bank A 412, the connection path switchover mechanism 414 starts its operation to be set such that the local memory bank B 413 is connected to the operating mechanism 408 and the local memory bank A 412 is connected to the local bus 407. Then, data are transmitted by the data transmission mechanism 404 from the local memory bank A 412 to the shared memory mechanism 403 (S4 in FIG. 10). At the same time, the first operating mechanism 408 is permitted to start the next first-dimension data process.

The data collected during the operation of the first operating mechanism 408 are transmitted to the operating mechanism 409 through the data latch 411. Then, in parallel with the operation performed by the first operating mechanism 408, they are processed using the local memory banks A 415 and B 416, the connection path switchover mechanism 417, and the data transmission mechanism 404. Then, they are transmitted to the shared memory mechanism 403 and accumulated therein (S1–S4 in FIG. 10).

The above described procedure is carried out M times until all the data are accumulated in the shared memory mechanism 403 (S5 in FIG. 10).

Figure 11:
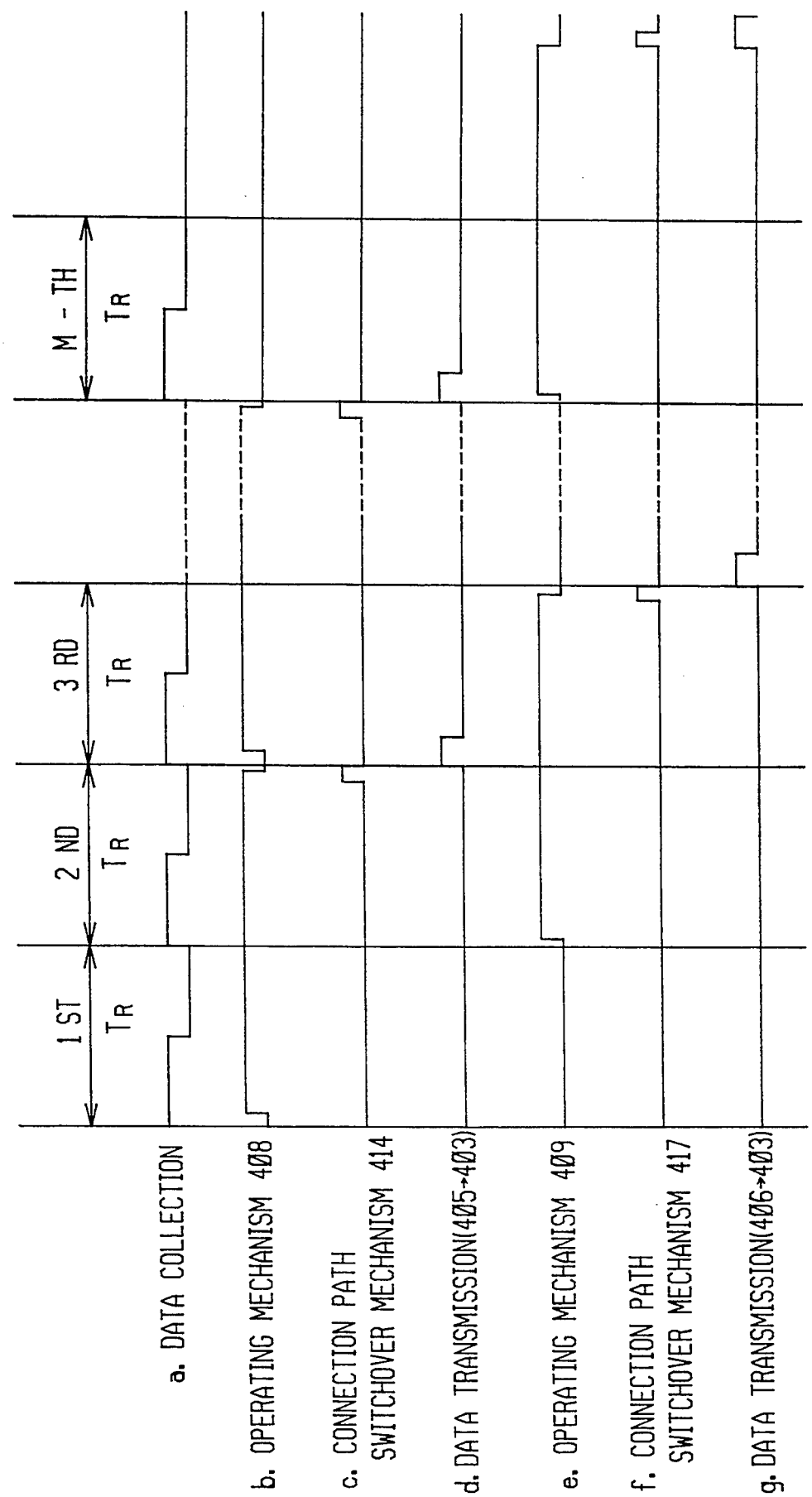
FIG. 11 is a time chart of the first-dimension data process executed in the two-dimensional Fourier transformation method.

FIG. 11 is a time chart for explaining the procedure above. In FIG. 11, a indicates data collecting timing, b indicates the timing of a read/write of data to be operated and an operation result of the first-dimension data processing operation performed by the first operating mechanism 408, c indicates the timing of a switchover of the connection path of the local memory banks A 412 and B 413 by the connection path switchover mechanism 414 in the local memory mechanism 405, d indicates the timing of a data transmission by the data transmission mechanism 404 from the local memory mechanism 405 to the shared memory mechanism 403, e indicates the timing of a read/write of data to be operated and an operation result of the first-dimension data processing operation performed by the first operating mechanism 409, f indicates the timing of a switchover of the connection path of the local memory banks A 415 and B 416 by the connection path switchover mechanism 417 in the local memory mechanism 406, and g indicates the timing of a data transmission by the data transmission mechanism 404 from the local memory mechanism 406 to the shared memory mechanism 403.

As shown in the general flowchart in FIG. 10, the second-dimension data process is started after all the data are collected and the first-dimension data process is completed for all the data. The second-dimension data process includes the one-dimensional FFT, absolute value calculation, data format transformation (transformation to the image data format), etc., and is performed in an M-point data column unit when L×M matrix image data are generated. This data process can also be performed by the operating mechanism after as much data as possible in the capacity of the local memory banks are transmitted collectively.

Figure 12:
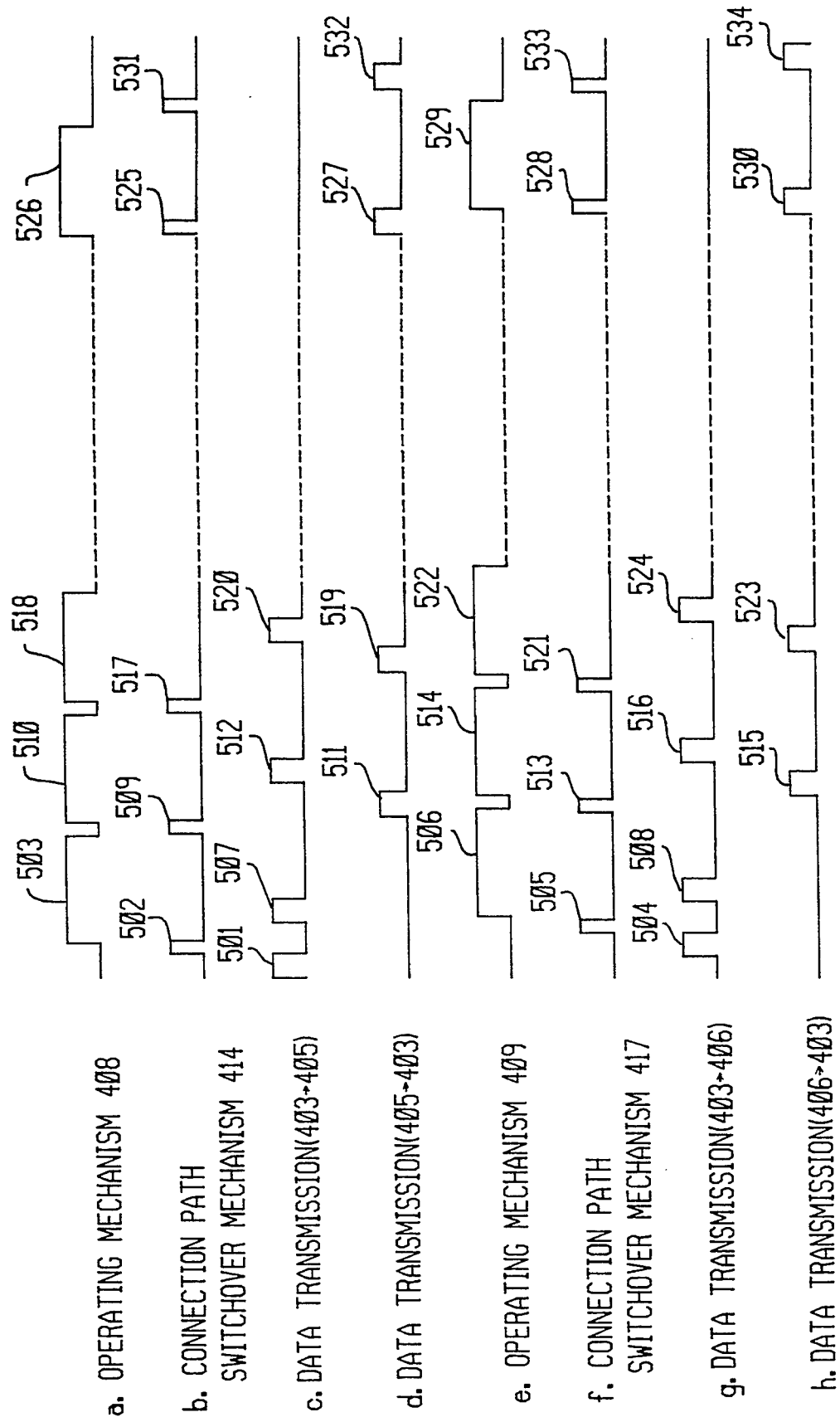
FIG. 12 is a time chart of the second-dimension data process executed in the two-dimensional Fourier transformation method.
Figure 13:
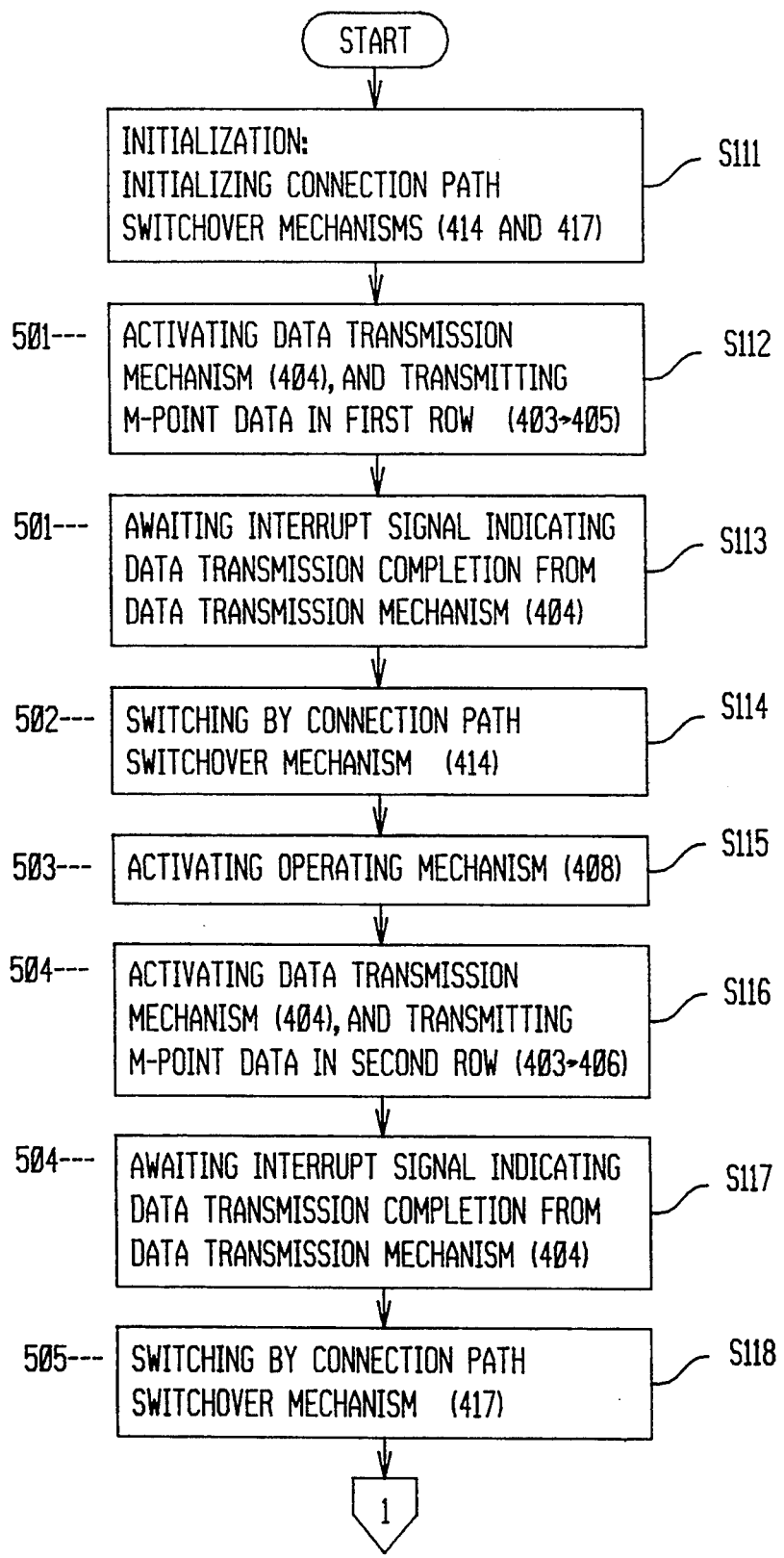
FIGS. 13–16 are flowcharts indicating the control process performed by the operating mechanism on the second-dimension data processes shown in FIG. 12.
Figure 14:
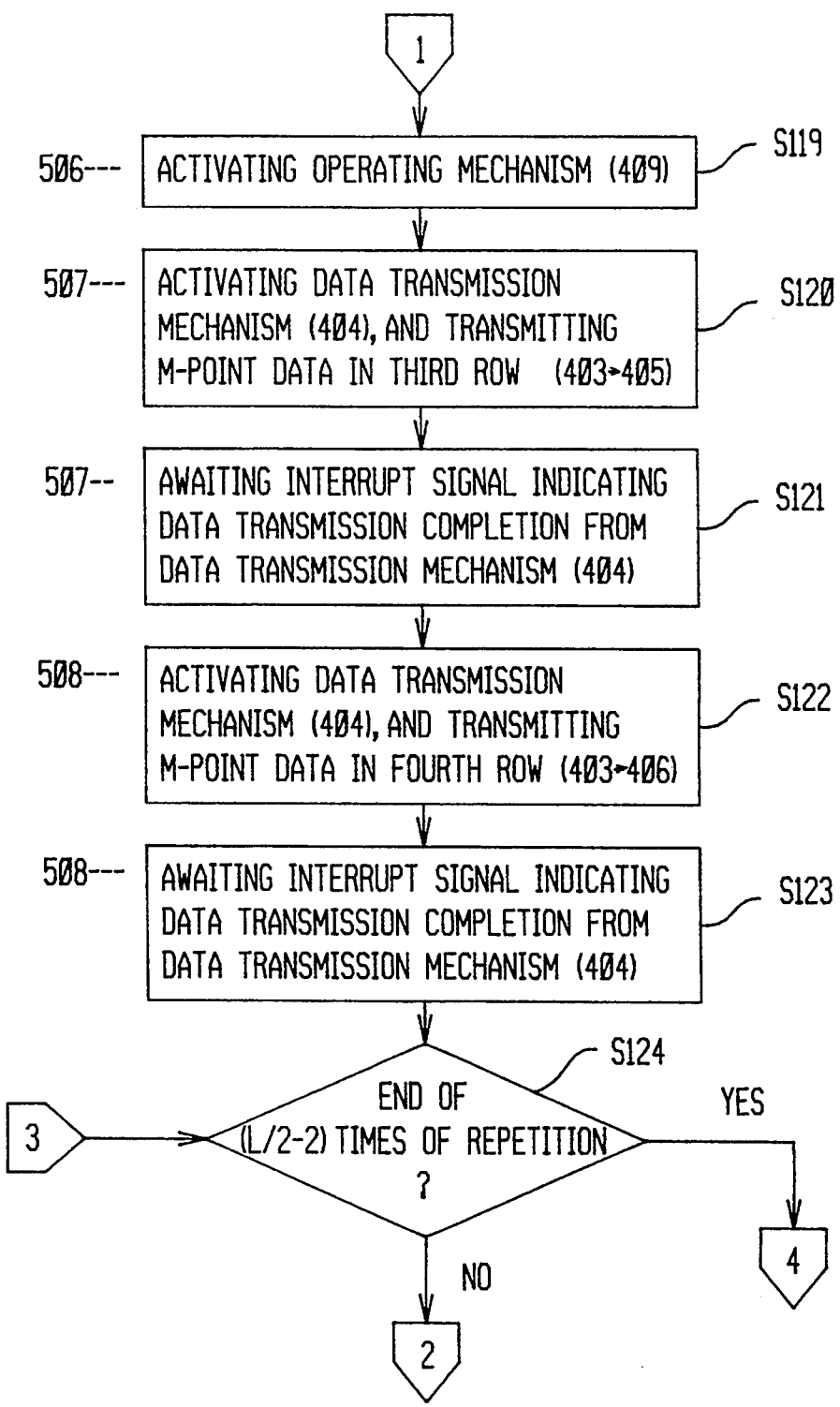
Figure 15:
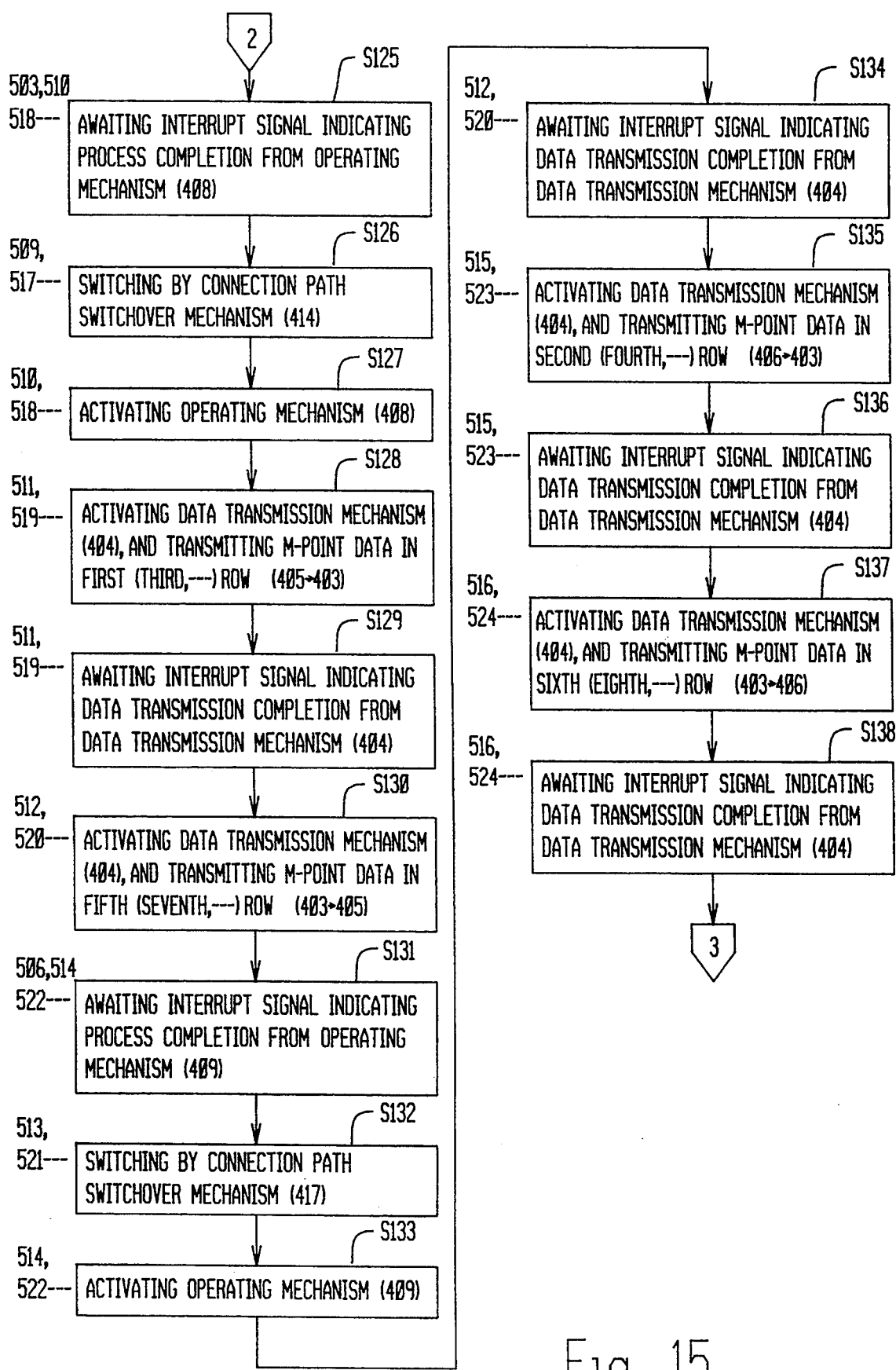
Figure 16:
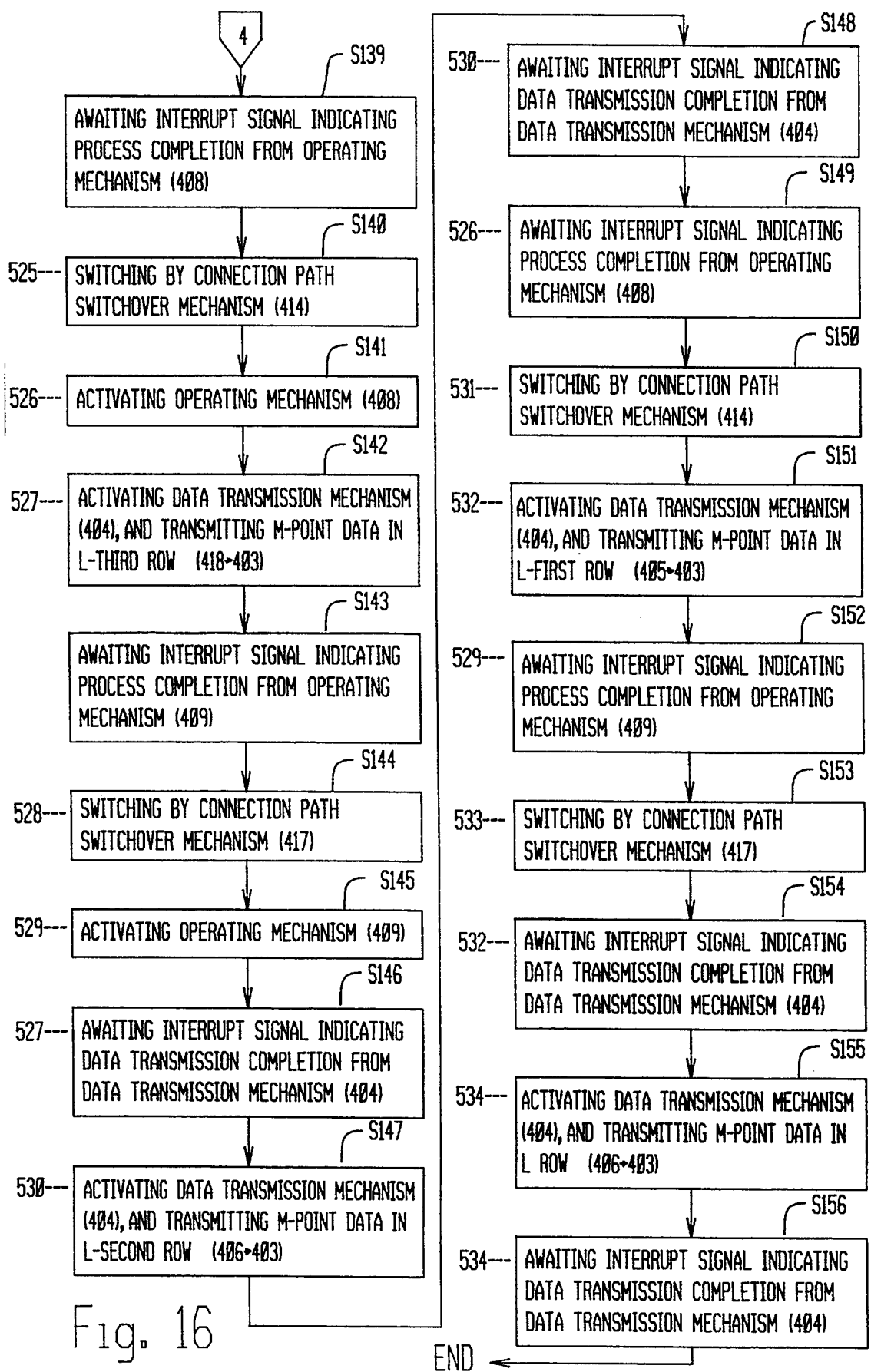

FIG. 12 shows an example of a time chart for explaining the execution of the second-dimension data process in the M-point data column.

In FIG. 12, a indicates the timing of a read/write of data to be operated and an operation result of the second-dimension data processing operation performed by the first operating mechanism 408, b indicates the timing of a switchover of the connection path of the local memory banks A 412 and B 413 by the connection path switchover mechanism 414 in the local memory mechanism 405, c indicates the timing of a data transmission by the data transmission mechanism 404 from the shared memory mechanism 403 to the local memory mechanism 405, d indicates the timing of a data transmission by the data transmission mechanism 404 from the local memory mechanism 405 to the shared memory mechanism 403, e indicates the timing of a read/write of data to be operated and an operation result of the second-dimension data processing operation performed by the first operating mechanism 409, f indicates the timing of a switchover of the connection path of the local memory banks A 415 and B 416 by the connection path switchover mechanism 417 in the local memory mechanism 406, and g indicates the timing of a data transmission by the data transmission mechanism 404 from the shared memory mechanism 403 to the local memory mechanism 406, and h indicates the timing of a data transmission by the data transmission mechanism 404 from the local memory mechanism 406 to the shared memory mechanism 403.

At the timing 501 shown in FIG. 12, the data in the first row is transmitted from the shared memory mechanism 403 to the local memory bank A 412 in the local memory mechanism 405 connected to the first operating mechanism 408. The connection path switchover mechanism 414 in the local memory mechanism 405 is set such that the local memory band A 412 is connected to the shared memory mechanism 403 and the local memory band B 412 is connected to the first operating mechanism 408.

After the transmission of the data, the connection path switchover mechanism 414 in the local memory mechanism 405 starts its operation (at the timing 502), the local memory bank A 412 is connected to the first operating mechanism 408, and the second-dimension data processing operation (at the timing 503) of the data in the first column is started. Since the data transmitting mechanism 404 is released at the same timing, the data in the second column is transmitted to the local memory bank A 415 in the local memory mechanism 406 connected to the second operating mechanism 409 (at the timing 504), the connection path switchover mechanism 417 in the local memory mechanism 406 starts its operation (at the timing 505), and the second-dimension data processing operation on the data in the second column is performed by the second operating mechanism 409 (at the timing 506).

In this operational state, both the memory banks B 413 and B 416 in the local memory mechanisms 405 and 406 respectively are connected to the local bath 407, and the data transmission mechanism 404 sequentially transmits the data in the third column and the fourth column from the shared memory mechanism 403 to the local memory banks B 413 and B 416 in the local memory mechanisms 405 and 406 respectively (at the timing 507 and 508 respectively) for the following data processes. When the second-dimension data processing operation on the data in the first column is completed (at the timing 503), the connection path switchover mechanism 414 in the local memory mechanism 405 restarts its operation (at the timing 509), the local memory bank B 413 is connected to the first operating mechanism 408, and the second-dimension data processing operation on the data in the third column which are stored in the local memory bank B 413 at the timing 507 is started (at the timing 510). Simultaneously, the processed data in the first column sored in the local memory bank A 412 in the local memory mechanism 405 are transmitted by the data transmission mechanism 404 to the shared memory mechanism 403 (at the timing 511). Then, the data in the fifth column are transmitted from the shared memory mechanism 403 to the local memory bank A 412 in the local memory mechanism 405 (at the timing 512).

Likewise, in the second operating mechanism 409 and the local memory mechanism 406, the operation on the data in the fourth column is performed, those in the second column are transmitted, and those in the sixth column are stored (at the timings 513, 514, 515, and 516).

As described above, operations and data transmissions are concurrently carried out by the two operating mechanisms 408 and 409, and the second-dimension data processing operation is performed on all the data (at the timings 518–534 and in steps S6–S9 in FIG. 10). These data are temporarily stored in the shared memory mechanism 403 after processed in an image regenerating operation, and collectively transmitted to the computer system bus 12 through the host interface mechanism 402 (in step S 10 shown in FIG. 10) and displayed on the console 16 (or sequentially displayed in the order they were processed in the operations).

All the above described operations and timing are controlled by the instruction control mechanism 401 shown in FIG. 8.

The second-dimension data processing operation by the instruction control mechanism 401 shown in FIG. 12 is explained below by referring to the flowcharts shown in FIGS. 13–16. A number shown at the upper left corner of each frame in these flowcharts corresponds to the number written in the time chart shown in FIG. 12. As preconditions of the second-dimension process, the data already processed in the first-dimension data process must be stored in the shared memory mechanism 403, and the processed data comprise $L \times M$ point elements.

First, at the initialization in step S 111, the instruction control mechanism 401 initializes the connection path switchover mechanisms 414, and 417. That is, the local memory nbanks A 412 and A 415 are connected to the local bus 407, and the local memory banks B 413 and 416 are connected to the operating mechanisms 408 and 409 respectively.

Next, in step S 112, the instruction control mechanism 401 outputs an activation signal to the data transmission mechanism 404 and activates it to transmit the M-point data in the first column from the shared memory mechanism 403 to the local memory mechanism 405.

Then, in step S 113, the instruction control mechanism 401 awaits the input from the data transmission mechanism 404 of an interrupt signal indicating the completion of a transmission. If, in step S 114, a transmission completion signal is applied by the data transmission mechanism 404, the instruction control mechanism 401 outputs an activation signal to the connection path switchover mechanism 414 to change the setting of the connection path. In this case, the local memory bank A 412 is connected to the operating mechanism 408, and the local memory bank B 413 is connected to the local bus 407.

Next, in step S 115, on receiving a switchover completion signal from the connection path switchover mechanism 414, the instruction control mechanism 401 outputs an activation signal to the operating mechanism 408 to start its operation.

In step S 116, the instruction control mechanism 401 outputs an activation signal .to the data transmission mechanism 404 when it outputs an activation signal to the connection path switchover mechanism 414 in step S 114, so that the M-point data in the second column can be transmitted from the shared memory mechanism 403 to the local memory mechanism 406.

Next, in step S 117, the instruction control mechanism 401 awaits the input from the data transmission mechanism 404 of an interrupt signal indicating the completion of a transmission.

Then, in step S 118, on receiving the transmission completion signal from the data transmission mechanism 404, the instruction control mechanism 401 outputs an activation signal to the connection path switchover mechanism 417 to change the setting of the connection path. The local memory bank A 415 is connected to the operating mechanism 409, and the local memory bank B 416 is connected to the local bus 407.

Next, in step S 119, on receiving the switchover completion signal from the connection path switchover mechanism 417, the instruction control mechanism 401 outputs an activation signal to the operating mechanism 409 to start its operation.

Then, in step S 120, the instruction control mechanism 401 outputs an activation signal to the data transmission mechanism 404 when it outputs an activation signal to the operating mechanism 409 in step S 119, so that the M-point data in the third column can be transmitted from the shared memory mechanism 403 to the local memory mechanism 405.

Next, in step S 121, the instruction control mechanism 401 awaits the input from the data transmission mechanism 404 of an interrupt signal indicating the completion of a transmission.

Then, in step S 122, on receiving the transmission completion signal from the data transmission mechanism 404, the instruction control mechanism 401 outputs an activation signal to the data transmission mechanism 404 to transmit M-point data in the fourth column from the shared memory mechanism 403 to the local memory mechanism 406.

In step S 123, the instruction control mechanism 401 awaits the input from the data transmission mechanism 404 of an interrupt signal indicating the completion of a transmission.

Next, in step S 124, determination is made as to whether or not the process has been repeated (L/2−2) times. If no (No in step S 124), control is transferred to step S 125.

In step S 125, the instruction control mechanism 401 awaits the input from the operating mechanism 408 of an interrupt signal indicating the completion of a process.

Then, in step S 126, on receiving the process completion signal from the operating mechanism 408, the instruction control mechanism 401 outputs an activation signal to the connection path switchover mechanism 414 to change the setting of the connection path. The local memory bank A 412 is connected to the local bus 407, and the local memory bank B 413 is connected to the operating mechanism 408.

In step S 127, on receiving a switchover completion signal from the connection path switchover mechanism 414, the instruction control mechanism 401 outputs an activation signal to the operating mechanism 408 to start its operation.

Then, in step S 128, the instruction control mechanism 401 outputs an activation signal to the data transmission mechanism 404 when it outputs an activation signal to the operating mechanism 408 in step S 127, so that the M-point data in the first (third, - - - ) column can be transmitted from the local memory mechanism 405 to the shared memory mechanism 403.

Next, in step S 129, the instruction control mechanism 401 awaits the input from the data transmission mechanism 404 of an interrupt signal indicating the completion of a data transmission.

In step S 130, on receiving the transmission completion signal from the data transmission mechanism 404, the instruction control mechanism 401 outputs an activation signal to the data transmission mechanism 404 so that the M-point data in the fifth (seventh, - - - ) column can be transmitted from the shared memory mechanism 403 to the local memory mechanism 405.

In step S 131, the instruction control mechanism 401 awaits the input from the operating mechanism 409 of an interrupt signal indicating the completion of a process.

In step S 132, on receiving the process completion signal from the operating mechanism 409, the instruction control mechanism 401 outputs an activation signal to the connection path switchover mechanism 417 to change the setting of the connection path. The local memory bank A 415 is connected to the local bus 407, and the local memory bank B 416 is connected to the operating mechanism 409.

In step S 133, on receiving the switchover completion signal from the connection path switchover mechanism 417, the instruction control mechanism 401 outputs an activation signal to the operating mechanism 409 to start its operation.

In step S 134, the instruction control mechanism 401 awaits the input from the data transmission mechanism 404 activated in step S 130 of an interrupt signal indicating the completion of a data transmission.

In step S 135, on receiving the transmission completion signal from the data transmission mechanism 404, the instruction control mechanism 401 outputs an activation signal to the data transmission mechanism 404 so that the M-point data in the second (fourth, - - - ) column can be transmitted from the local memory mechanism 406 to the shared memory mechanism 403.

In step S 136, the instruction control mechanism 401 awaits the input from the data transmission mechanism 404 of an interrupt signal indicating the completion of a data transmission.

Then, in step S 137, on receiving the transmission completion signal from the data transmission mechanism 404, the instruction control mechanism 401 outputs an activation signal to the data transmission mechanism 404 so that the M-point data in the sixth (eighth, - - - ) column are transmitted from the shared memory mechanism 403 to the local memory mechanism 406.

In step S 138, the instruction control mechanism 401 awaits the input from the data transmission mechanism 404 of an interrupt signal indicating the completion of a data transmission.

Then, in step S 124, determination is made as to whether or not the process has been repeated (L/2−2) times. If no (No in step S 124), control is transferred to step S 125 to perform the step S 126 and the following steps.

If yes (Yes in step S 124), control is transferred to step S 139.

In step S 139, the instruction control mechanism 401 awaits the input from the operating mechanism 408 of an interrupt signal indicating the completion of a process.

Next, in step S 140, on receiving the process completion signal from the operating mechanism 408, the instruction mechanism 401 outputs an activation signal to the connection path switchover mechanism 414 to change the setting of the connection path. Then, for example, the local memory bank A 412 is connected to the local bus 407, and the local memory bank B 413 is connected to the operating mechanism 408.

In step S 141, on receiving the switchover completion signal from the connection path switchover mechanism 414, the instruction control mechanism 401 outputs an activation signal to the operating mechanism 408 to start its operation.

In step S 142, the instruction control mechanism 401 outputs an activation signal to the data transmission mechanism 404 when it outputs an activation signal to the operating mechanism 408 in step S 141, so that the M-point data in the (L−3)th column are transmitted after processed in operations from the local memory mechanism 405 to the shared memory mechanism 403.

In step S 143, the instruction control mechanism 401 awaits the input from the operating mechanism 409 of an interrupt signal indicating the completion of a process.

In step S 144, on receiving from the operating mechanism 409 the interrupt signal indicating the completion of a process, the instruction control mechanism 401 outputs an activation signal to the connection path switchover mechanism 417 to change the setting of the connection path. Then, for example, the local memory bank A 415 is connected to the local bus 407, and the local memory bank B 416 is connected to the operating mechanism 409.

In step S 145, on receiving a switchover completion signal from the connection path switchover mechanism 417, the instruction control mechanism 401 outputs an activation signal to the operating mechanism 409 to start its operation.

Next, in step S 146, the instruction control mechanism 401 awaits the input from the data transmission mechanism 404 activated in step S 142 of an interrupt signal indicating the completion of a transmission.

In step S 147, on receiving the transmission completion signal from the data transmission mechanism 404, the instruction control mechanism 401 outputs an activation signal to the data transmission mechanism 404 so that the M-point data in the (L−2)th column are transmitted after processed in operations from the local memory mechanism 406 to the shared memory mechanism 403.

In step S 148, the instruction control mechanism 401 awaits the input from the data transmission mechanism 404 of an interrupt signal the completion of a data transmission.

In step S 149, the instruction control mechanism 401 awaits the input from the operating mechanism 408 of an interrupt signal indicating the completion of a process.

In step S 150, on receiving the process completion signal from the operating mechanism 408, the instruction control mechanism 401 outputs an activation signal to the connection switchover mechanism 414 to change the setting of the connection path. Then, for example, the local memory bank A 412 is connected to the operating mechanism 408, and the local memory bank B 413 is connected to the local bus 407.

In step S 151, on receiving the switchover completion signal from the connection path switchover mechanism 414, the instruction control mechanism 401 outputs an activation signal to the data transmission mechanism 404 so that the M-point data of the (L−1)th column are transmitted after processed in operations from the local memory mechanism 405 to the shared memory mechanism 403.

In step S 152, the instruction control mechanism 401 awaits the input from the operating mechanism 409 of an interrupt signal indicating the completion of a process.

In step S 153, on receiving the process completion signal from the operating mechanism 409, the instruction control mechanism 401 outputs an activation signal to the connection path switchover mechanism 417 to change the setting of the connection path.

In step S 154, the instruction control mechanism 401 awaits the input from the data transmission mechanism 404 of an interrupt signal indicating the completion of a data transmission.

In step S 155, on receiving the transmission completion signal from the data transmission mechanism 404, the instruction control mechanism 401 outputs an activation signal to the data transmission mechanism 404 so that the M-point data in the L-th column are transmitted after processed in operations from the local memory mechanism 406 to the shared memory mechanism 403.

Next, in step S 156, the instruction control mechanism 401 awaits the input from the data transmission mechanism 404 of an interrupt signal indicating the completion of a data transmission.

Thus, the two-dimensional process is completed.

Figure 17:
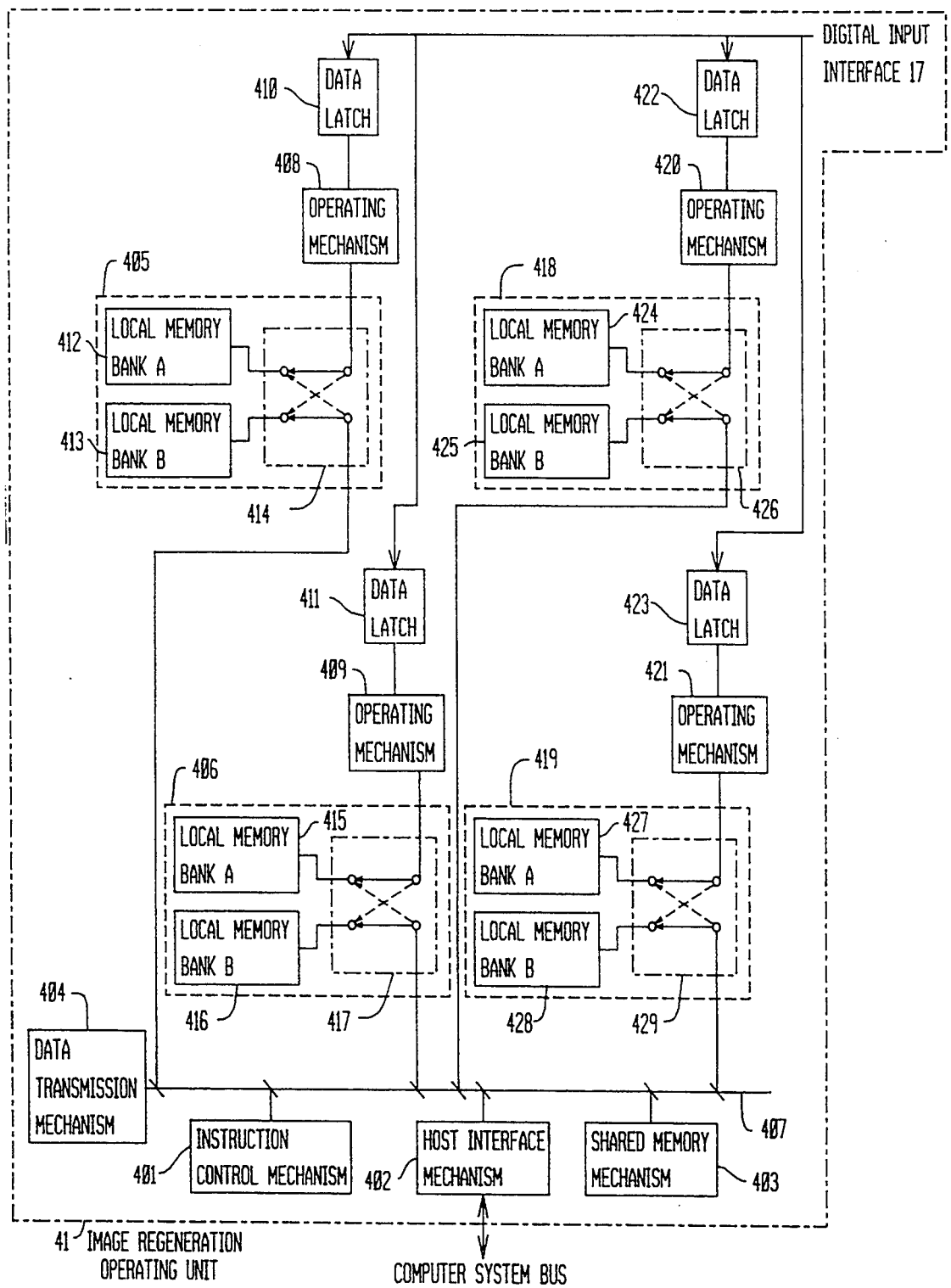
FIG. 17 shows the configuration of the important part of an embodiment of the second principle.

Next, FIG. 17 shows an embodiment of the second principle of the present invention in which an image is constructed using the three-dimensional Fourier transformation method.

Unlike the one shown in FIG. 8, this embodiment comprises four sets of operating mechanisms and local memory mechanisms. However, it is obvious that it also can comprise a larger number of sets of operating and local memory mechanisms. In the configuration that shown in FIG. 8, an image constructing operation described below can be performed without any problems. However the number of operations concurrently performed decreases.

In an image construct operating unit 41 shown in FIG. 17, numbers 401–417 refer to the same parts shown in FIG. 8, and the explanation is omitted here. 418, 420, and 422 are a third local memory mechanism, a third operating mechanism, and a third data latch respectively. 419, 421, and 423 are a fourth local memory mechanism, a fourth operating unit, and a fourth data latch. 424–426 are local memory banks A and B and a connection path switchover mechanism in the third local memory mechanism 418. Likewise, 427–429 are local memory banks A and B and a connection path switchover mechanism in the fourth local memory mechanism 419. With this configuration, the example of the nuclear magnetic resonance imaging system is the same as that shown in FIG. 9.

Figure 4:
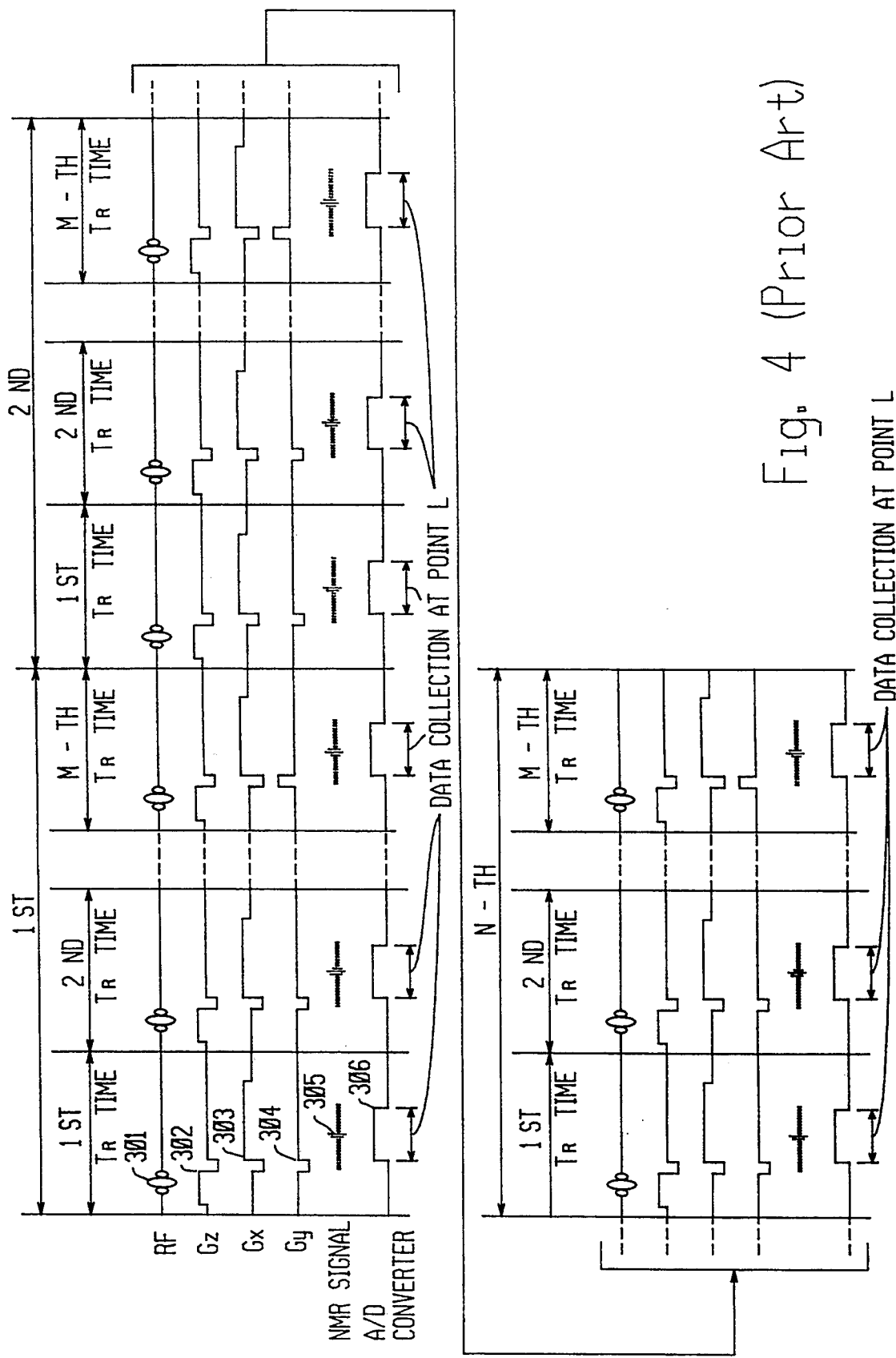
FIG. 4 is a view for explaining the data collection timing when the three-dimensional Fourier transformation method is applied.
Figure 5:
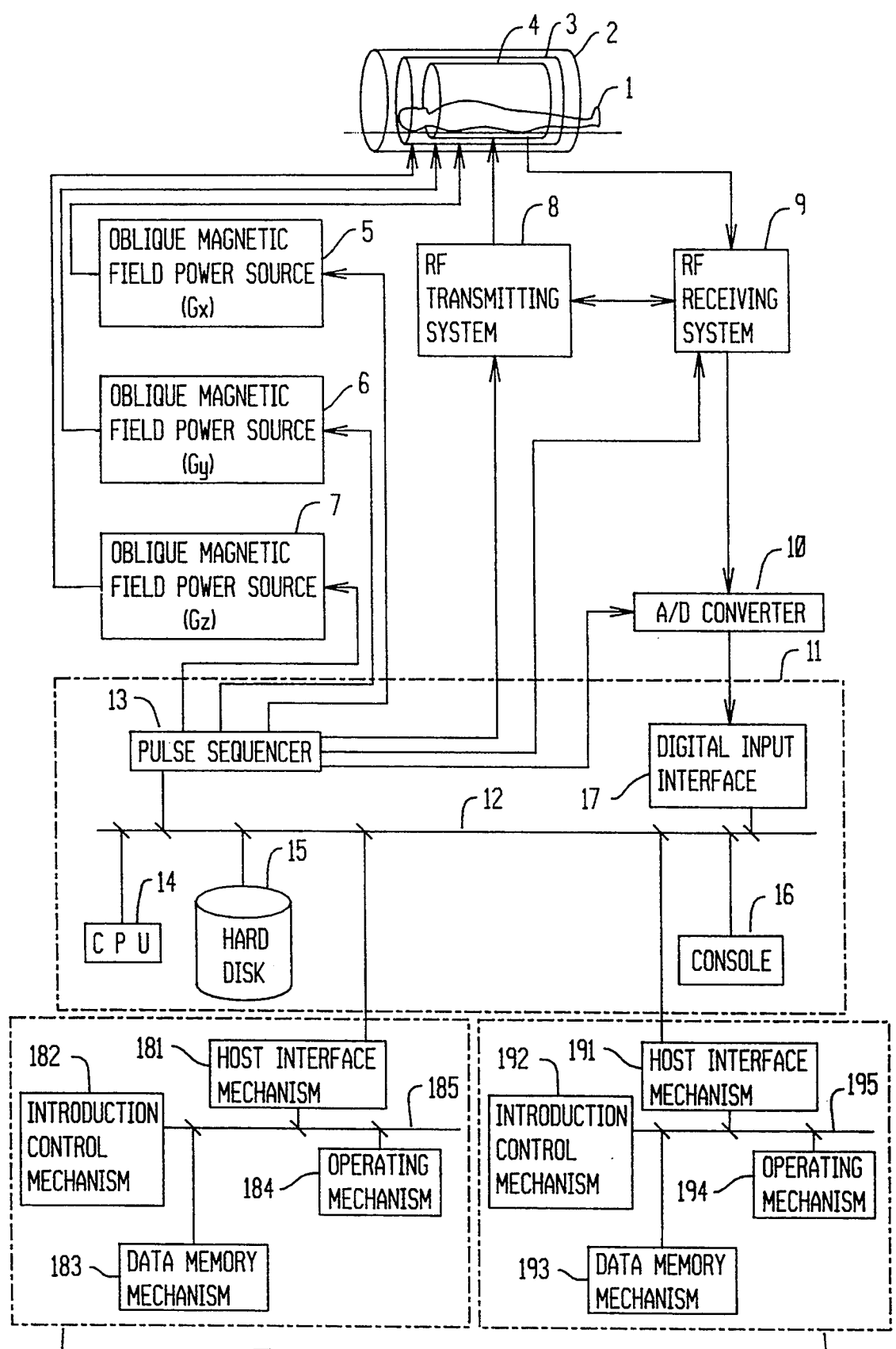
FIG. 5 shows the configuration of the conventional image construct operating unit in which the three-dimensional Fourier transformation method is applied.
Figure 18:
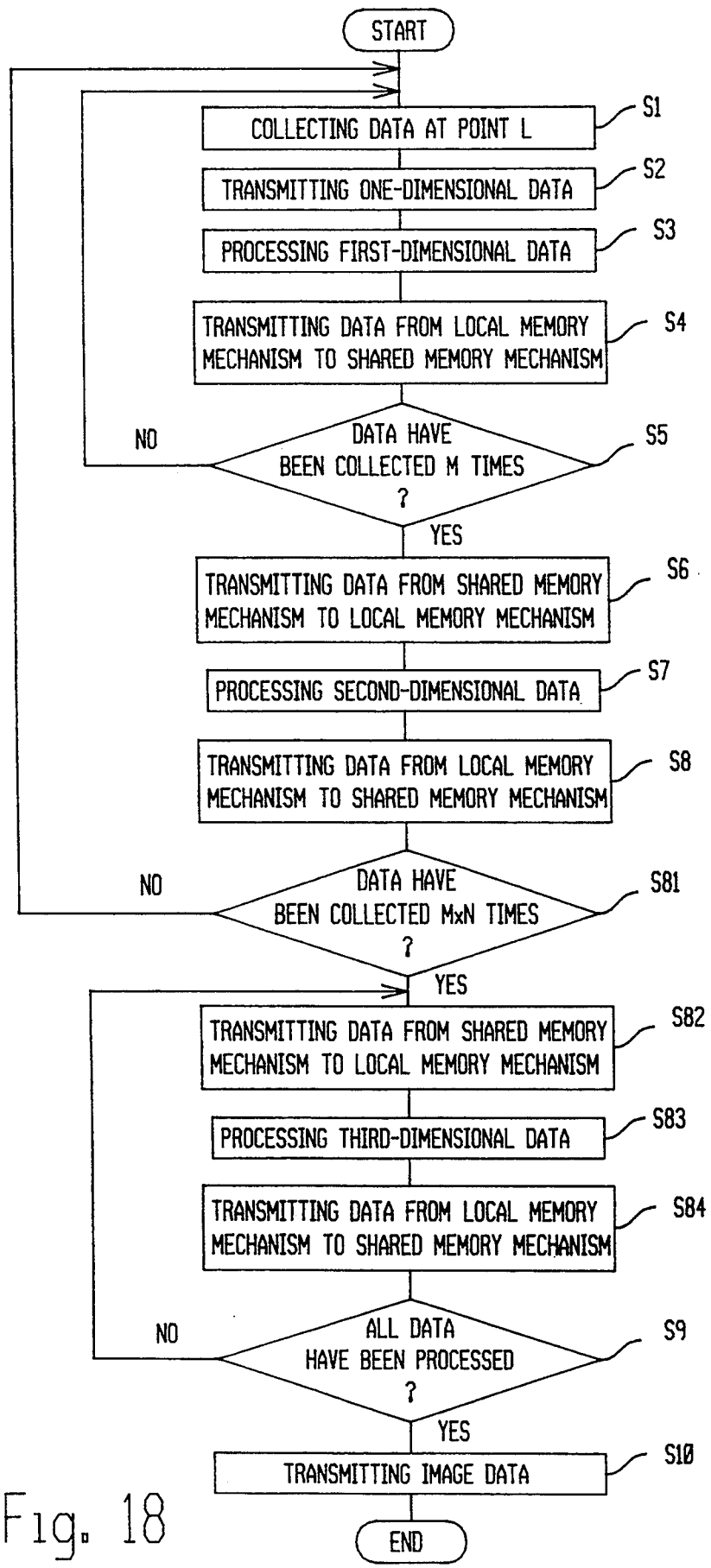
FIG. 18 is a general flowchart for explaining the image construct operating process executed in the three-dimensional Fourier transformation method.

FIG. 18 is a general flowchart of an image construct operating program in which data are collected at the data collecting timing shown in FIG. 4 and an L×M×N matrix image can be obtained by the three-dimensional Fourier transformation method.

When the three-dimensional Fourier transformation method is applied, the first-dimension data process (including the process for signals of a digital filter, direct current correction, phase correction, etc. and for a one-dimensional complex FFT, etc.) and the second-dimension data process (including the process for a one-dimensional complex FFT, etc.) are performed in parallel with data collections. In the following explanation about the operation of the present embodiment, two sets of operating mechanisms and local memory mechanisms in four sets are used for the first-dimension data process, and the other two sets are used for the second-dimension data process. The combination in the four sets can be varied according to the load of each process.

The collected L-point data are transmitted by the digital input interface 17 shown in FIG. 9 to the first operating mechanism 408 in the image construct operating system 41 through the data latch 410 shown in FIG. 17. The first operating mechanism 408 performs an operation necessary for the first-dimension data process using the memory in the local memory mechanism 405, and writes the operation result to the local memory mechanism 405. Then, the connection path switchover mechanism 414 in the local memory mechanism 405 is set such that the local memory bank A 412 is connected to the operating mechanism 408 and the local memory bank B 413 is connected to the local bus 407.

When the first-dimension data processing operation is completed by the first operating mechanism 408, and immediately after the operation result is accumulated in the local memory bank A 412, the connection path switchover mechanism 414 starts its operation. Then, the local memory bank B 413 is connected to the operating mechanism 408 and the local memory bank A 412 is connected to the local bus 407 to permit the data transmission mechanism 404 to start transmitting data from the local memory bank A 412 to the shared memory mechanism 403. Simultaneously, the first operating mechanism 408 is allowed to start the next first-dimension data process.

The data collected during the operation performed by the first operating mechanism 408 are transmitted to the second operating mechanism 409 through the data latch 411, processed by the local memory banks A 415 and B 416, the connection path switchover mechanism 417, and the data transmission mechanism 404, and are transmitted to the shared memory mechanism 403 and accumulated therein like in the first operating mechanism 408.

Thus, L-point data are collected M times, until the first-dimension data process is completed, L×M-point data sets are accumulated in the shared memory mechanism 403 (step S1–S5 shown in FIG. 18), and the second-dimension data process can thus be performed. The second-dimension data process is performed by the third and the fourth local memory mechanism/operating mechanism 418, 420, 419, and 421 like in the second-dimension data process in the embodiment in which the above described two-dimensional Fourier transformation method is applied. In parallel with the second-dimension data process performed by the third and the fourth local memory mechanism/operating units 418, 420, 419, and 421, the data collection and the first-dimension data process performed by the first and the second local memory mechanisms/operating mechanisms 405, 408, 406, and 409 are executed concurrently.

The above procedure is repeated M×N times until all the data are accumulated in the shared memory mechanism 403 (S6, S7, S8, and S81 shown in FIG. 18). The time charts of the above procedure are shown in FIGS. 19, 20, and 21.

Figure 19:
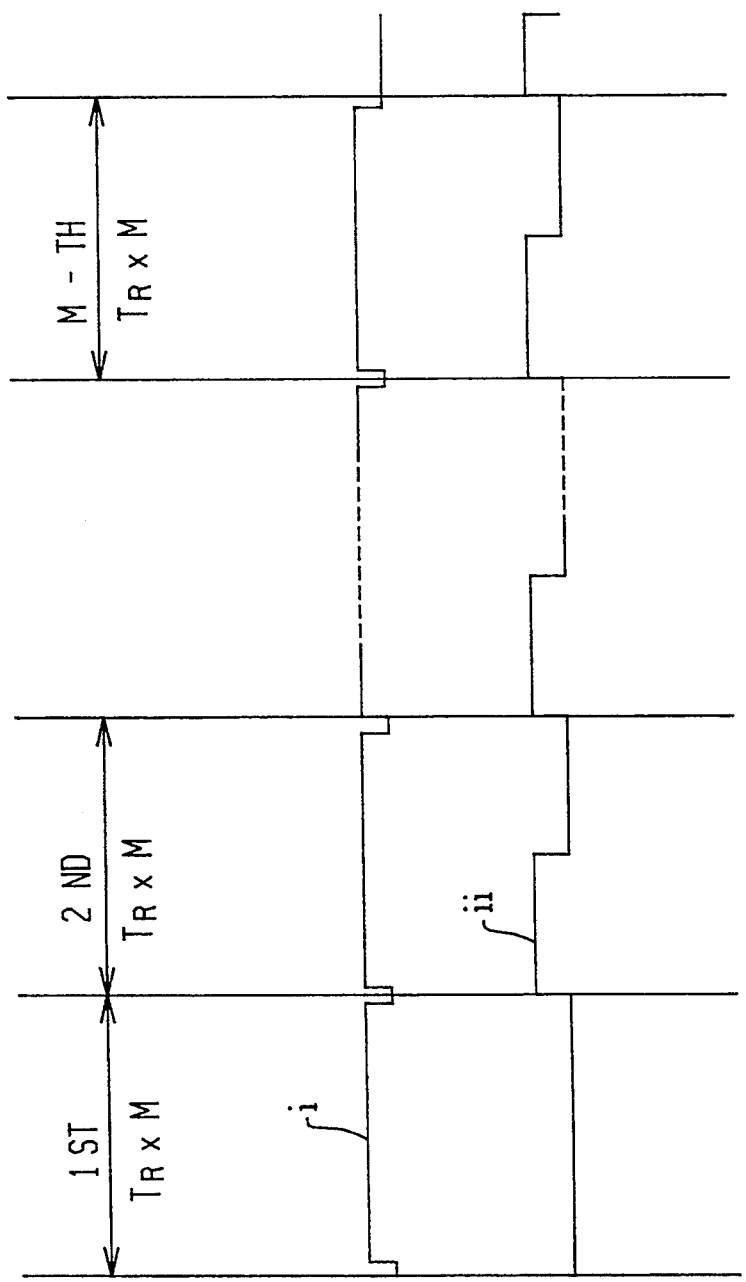
FIG. 19 is a time chart of the data collection and the first- and second-dimension data processes executed in the three-dimensional Fourier transformation method.

In FIG. 19, a indicates the data collection and the first-dimension data process performed by the first and the second operating mechanisms 408 and 409; and b indicates the second-dimension data process performed by the third and the fourth operating mechanisms 420 and 421.

Figure 20:
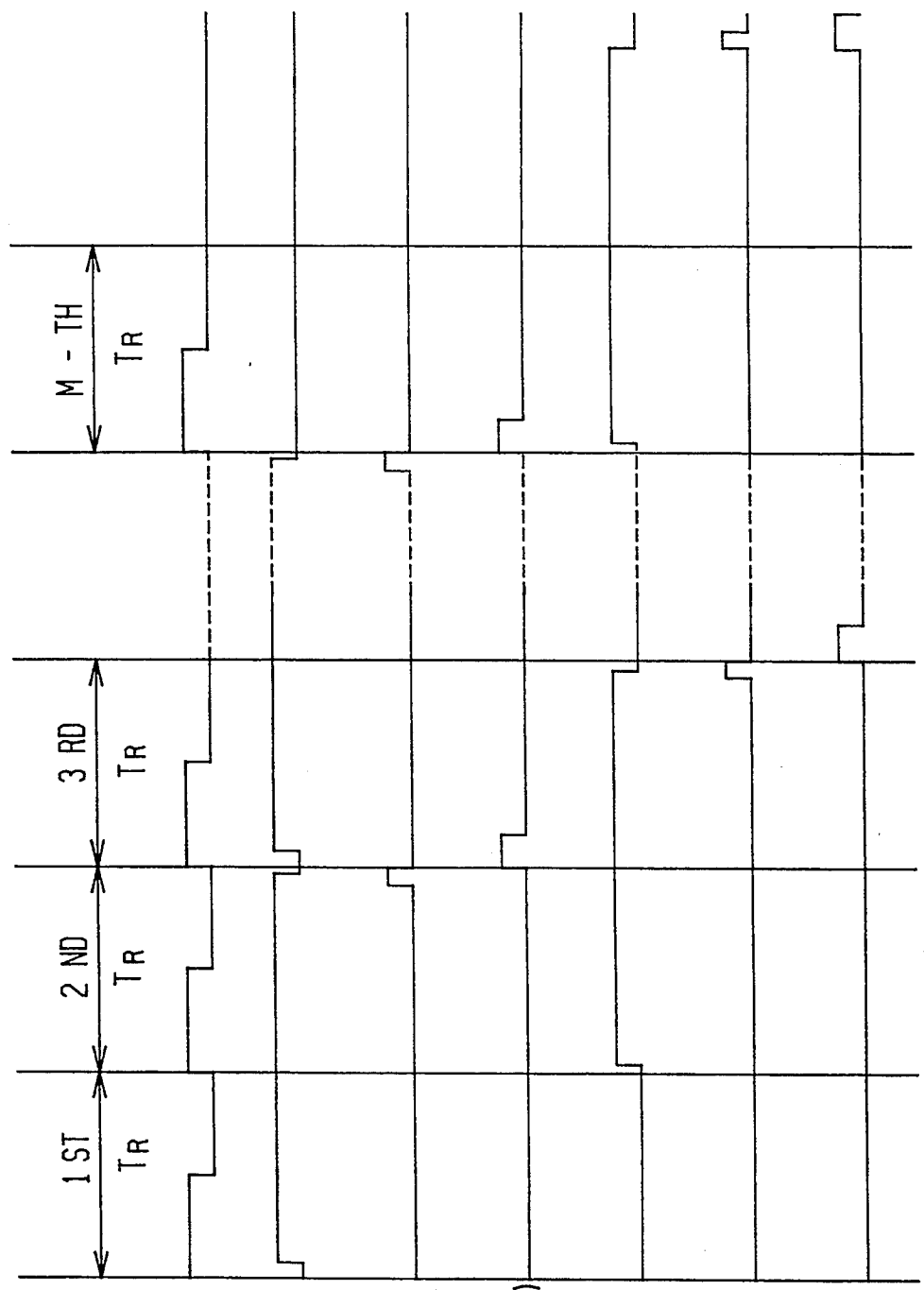
FIG. 20 is a time chart of the data collection and the first-dimension data process executed in the three-dimensional Fourier transformation method.

FIG. 20 shows in detail the part (i) in FIG. 19, that is, the data collection of L×M points and the timing of M times of the first-dimension data process. In FIG. 20, c indicates a data collecting timing, d indicates the timing of a read/write of data to be operated and an operation result of the first-dimension data processing operation performed by the first operating mechanism 408, e indicates the timing of a switchover of the connection path of the local memory banks A 412 and B 413 by the connection path switchover mechanism 414 in the local memory mechanism 405, f indicates the timing of a data transmission by the data transmission mechanism 404 from the local memory mechanism 405 to the shared memory mechanism 403, g indicates the timing of a read/write of data to be operated and an operation result of the first-dimension data processing operation performed by the first operating mechanism 409, h indicates the timing of a switchover of the connection path of the local memory banks A 415 and B 416 by the connection path switchover mechanism 417 in the local memory mechanism 406, and i indicates the timing of a data transmission by the data transmission mechanism 404 from the local memory mechanism 406 to the shared memory mechanism 403.

Figure 21:
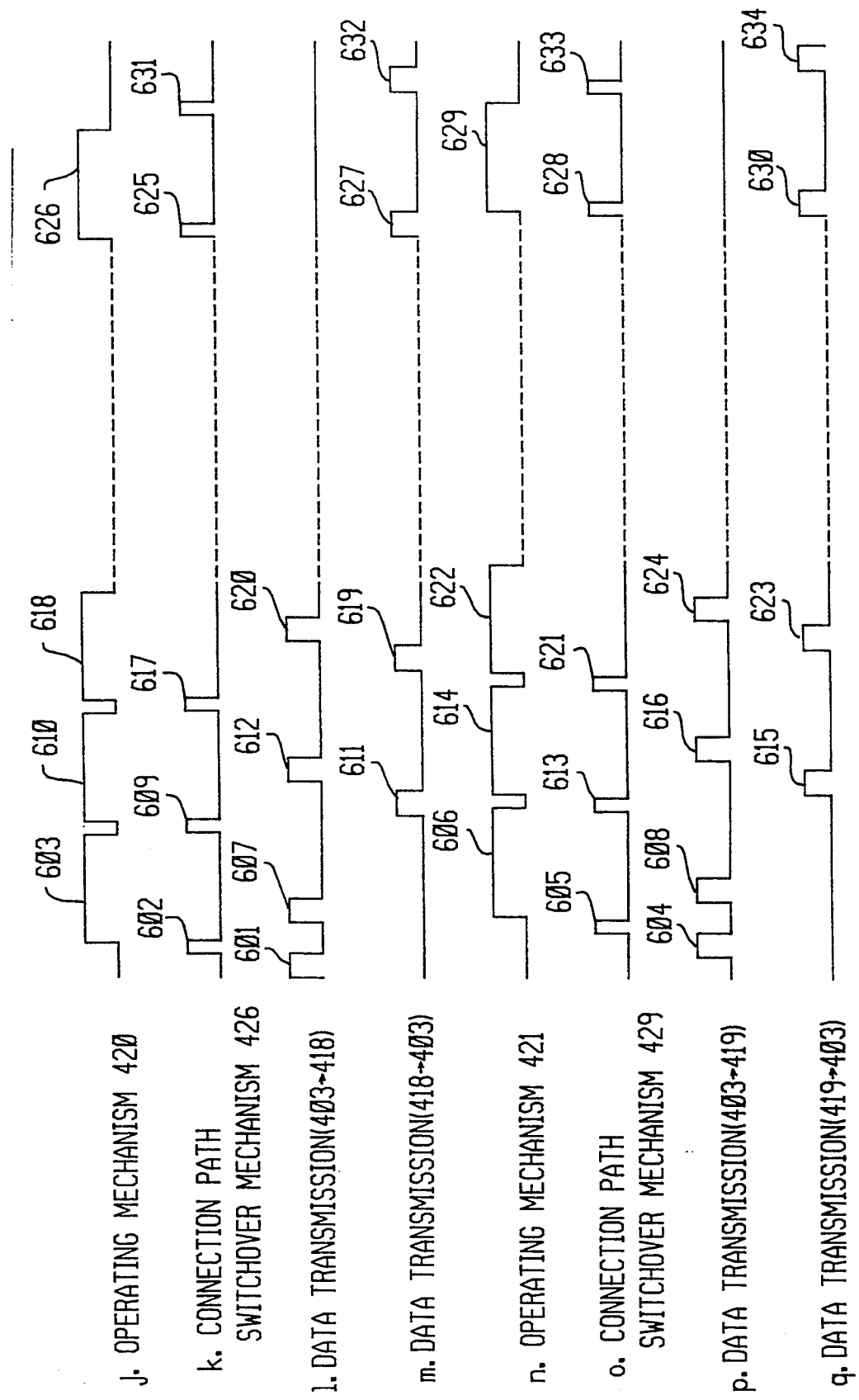
FIG. 21 is a time chart of the second-dimension data process executed in the three-dimensional Fourier transformation method.

FIG. 21 shows the part (ii) in FIG. 19 in detail that is, the timing of the second-dimension data process of L×M points.

In FIG. 21, j indicates the timing of a read/write of data to be operated and an operation result of the second-dimension data processing operation performed by the third operating mechanism 420, k indicates the timing of a switchover of the connection path of the local memory banks A 424 and B 425 by the connection path switchover mechanism 426 in the local memory mechanism 418, l indicates the timing of a data transmission by the data transmission mechanism 404 from the shared memory mechanism 403 to the local memory mechanism 418, m indicates the timing of a data transmission by the data transmission mechanism 404 from the local memory mechanism 418 to the shared memory mechanism 403, n indicates the timing of a read/write of data to be operated and an operation result of the second-dimension data processing operation performed by the fourth operating mechanism 421, o indicates the timing of a switchover of the connection path of the local memory banks A 427 and B 428 by the connection path switchover mechanism 429 in the local memory mechanism 419, p indicates the timing of a data transmission by the data transmission mechanism 404 from the shared memory mechanism 403 to the local memory mechanism 419, and q indicates the timing of a data transmission by the data transmission mechanism 404 from the local memory mechanism 419 to the shared memory mechanism 403.

As for numbers 601–634 indicating the timing of the operation shown in FIG. 21, they are the same as those shown in FIG. 12 except that the first and the second local memory mechanisms/operating mechanisms (405, 408, 406, and 409 also shown in FIG. 17) in FIG. 12 are replaced with the third and the fourth local memory mechanisms/operating mechanisms (418, 420, 419, and 421 in FIG. 17). Therefore, the explanation is omitted here.

As shown in a general flowchart in FIG. 18, when all the data are collected and the first- and the second-dimension data processes for all the data are completed (steps S1–S8 and S81 in FIG. 18), the third-dimension data process is performed. The third-dimension data process includes the one-dimensional complex FFT, calculation of an absolute value, transformation of a data format (to the image data format), etc. When L×M×N-matrix image data are generated, the process is repeated L×M times in N-data-string units, and the data are transmitted as much as the local memory bank capacity allows to be collectively processed by an operating mechanism.

Figure 22:
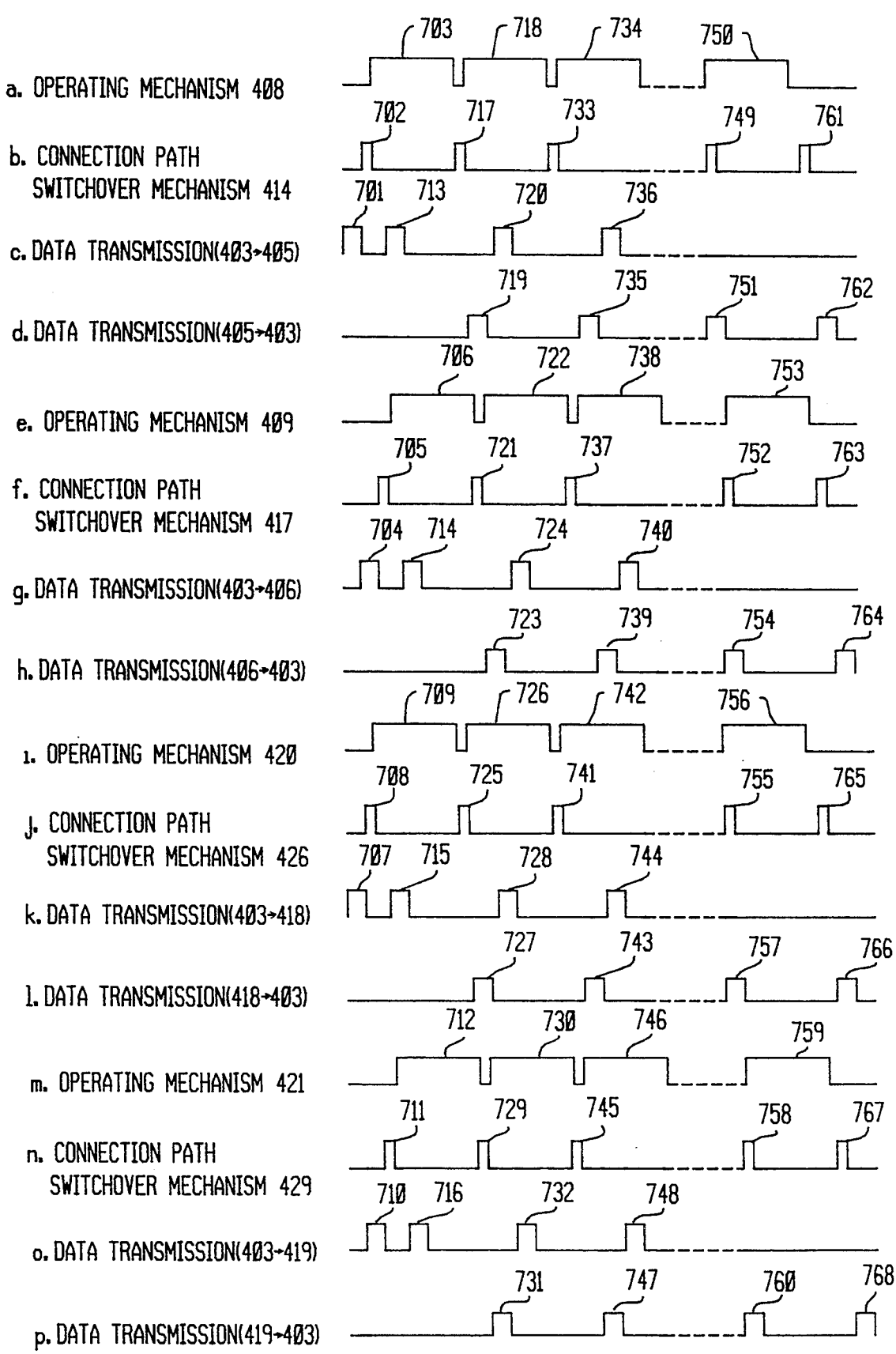
FIG. 22 shows a time chart of the third-dimension data process executed in the three-dimensional Fourier transformation method.
Figure 23:
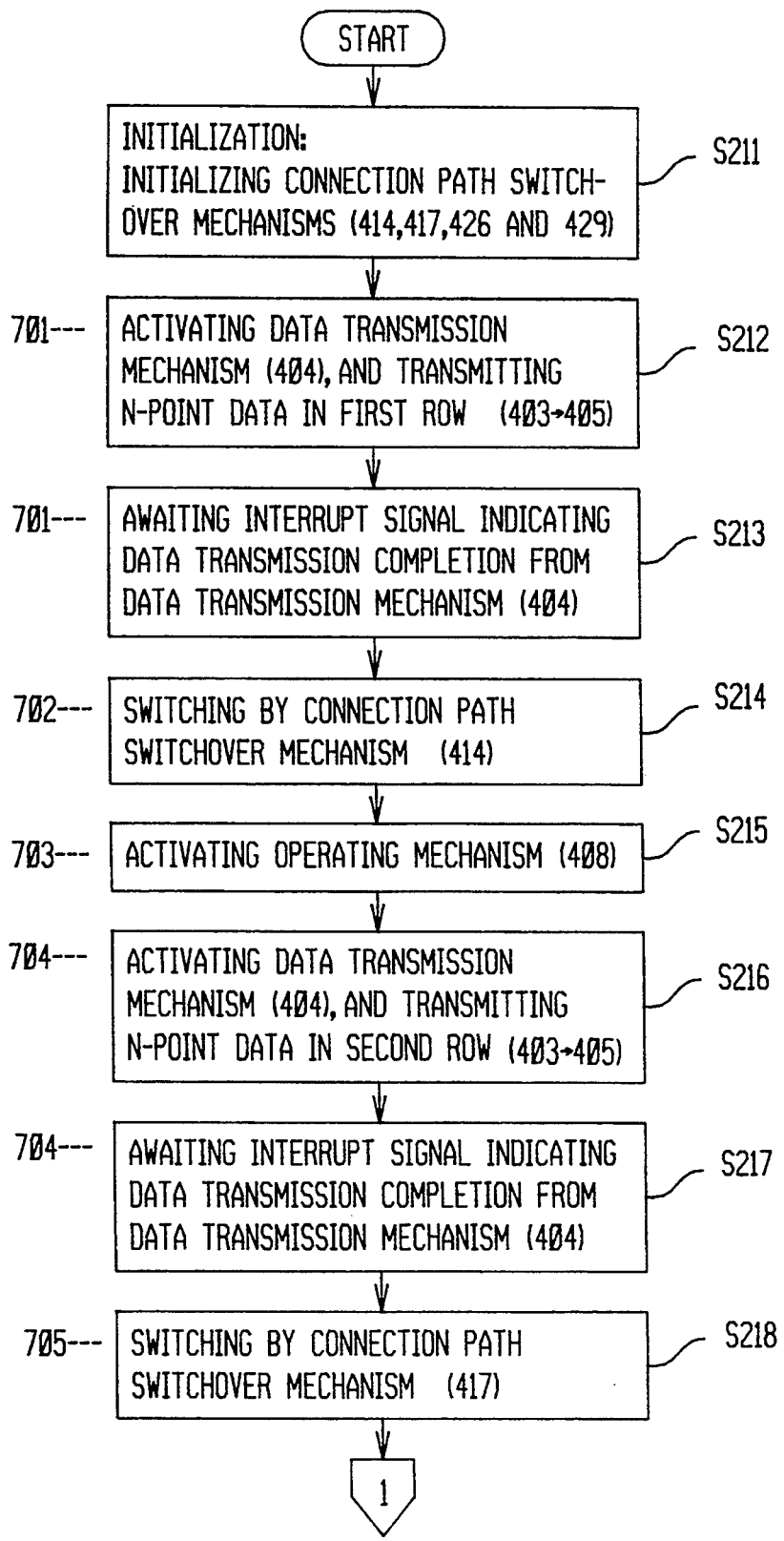
FIGS. 23–30 are flowcharts for explaining the control process performed by the operating mechanism on the third-dimension data processes shown in FIG. 22.
Figure 24:
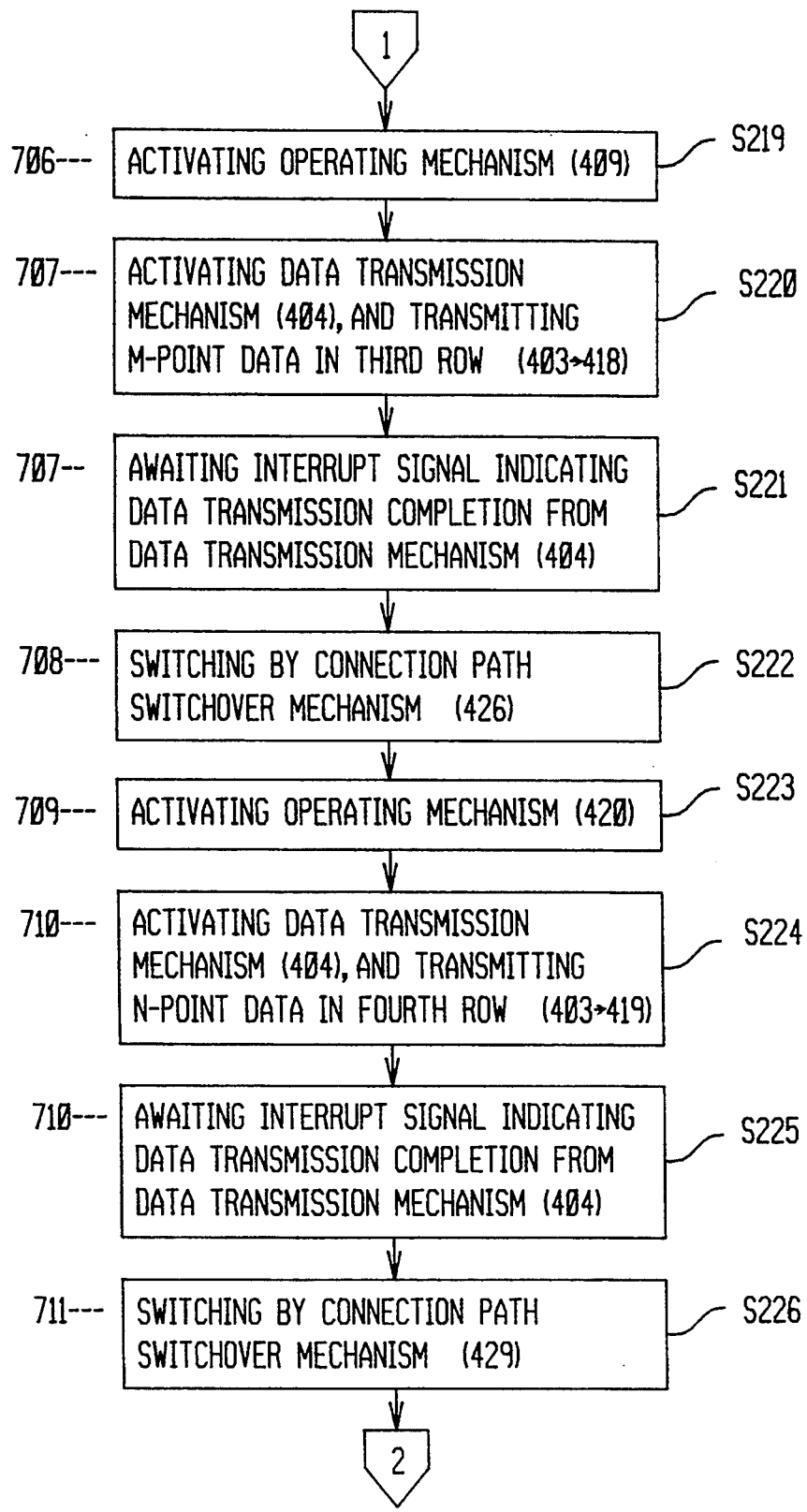
Figure 25:
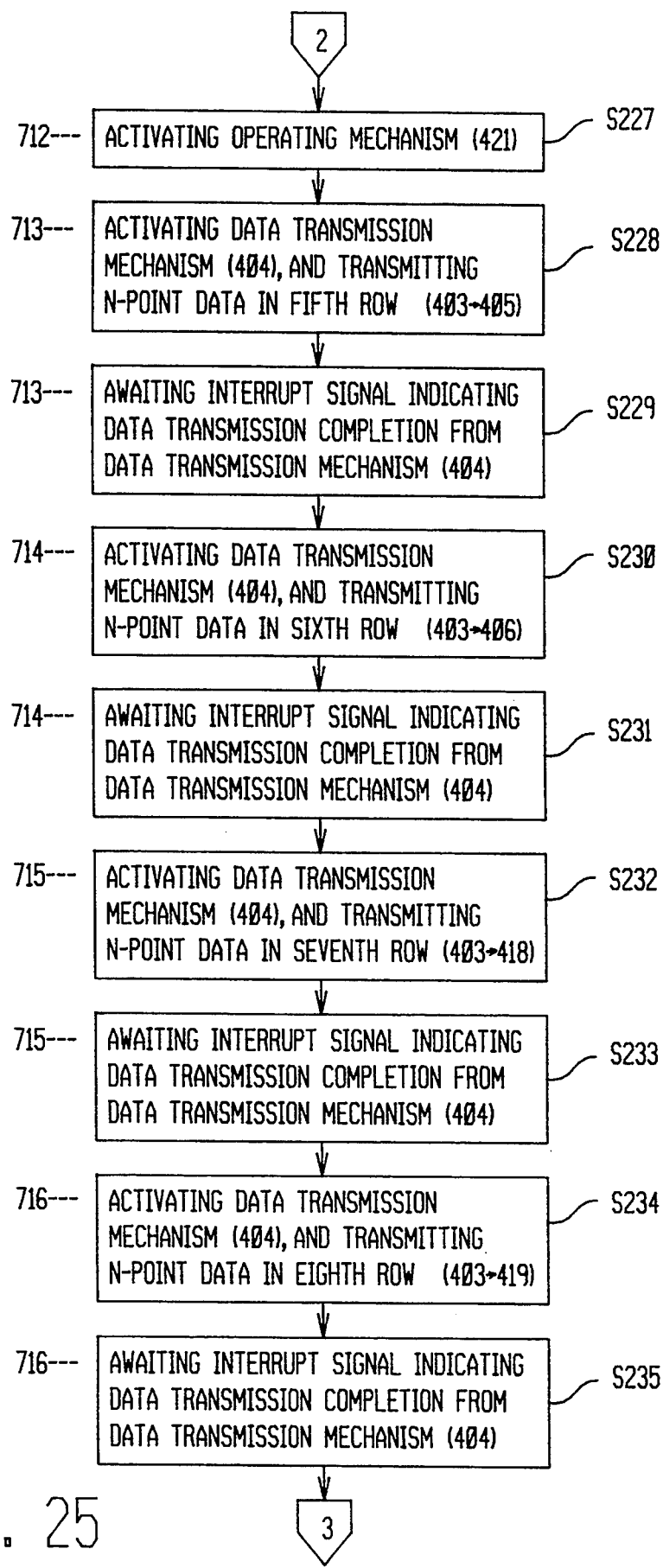
Figure 26:
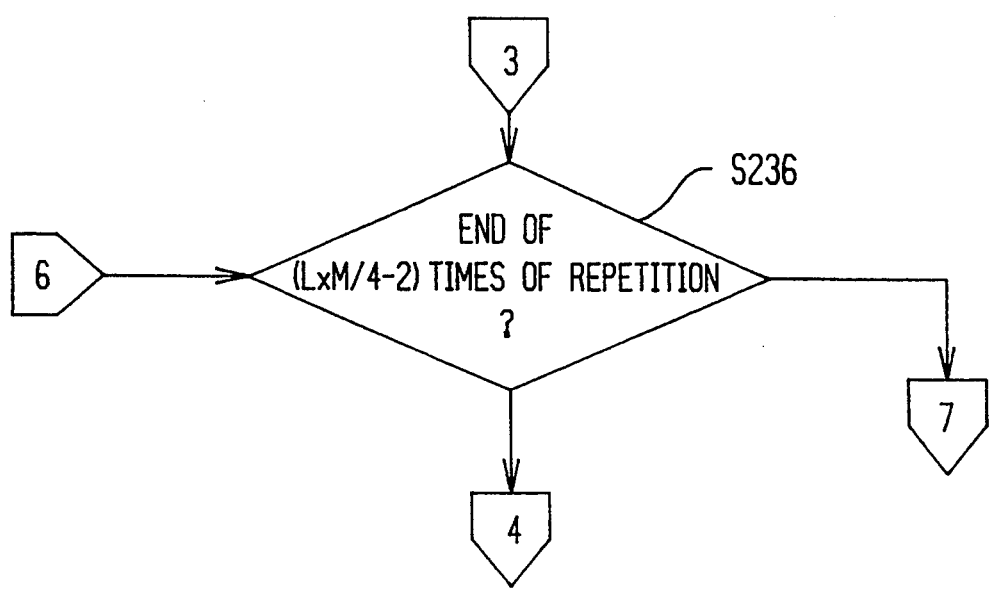
Figure 27:
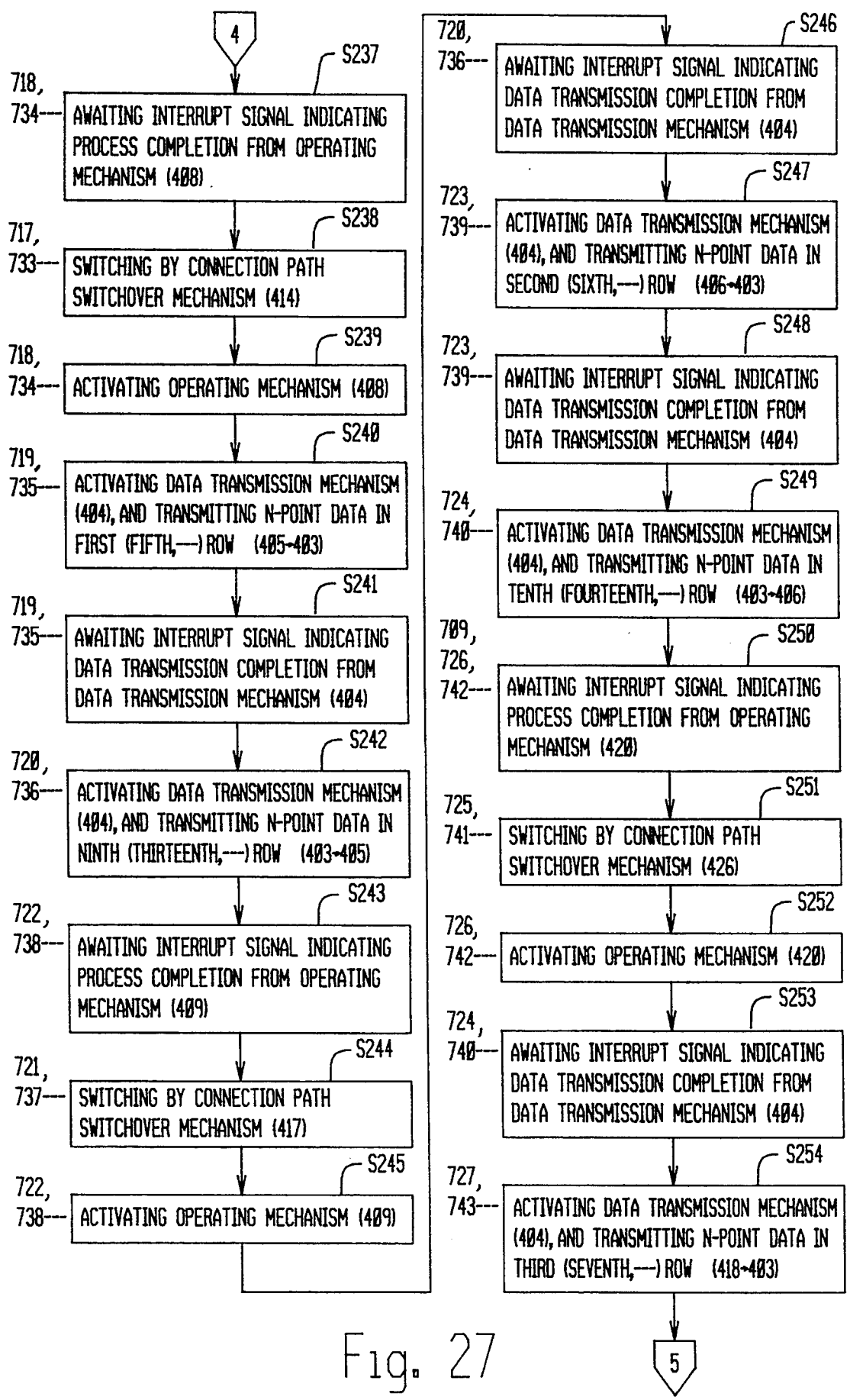
Figure 28:
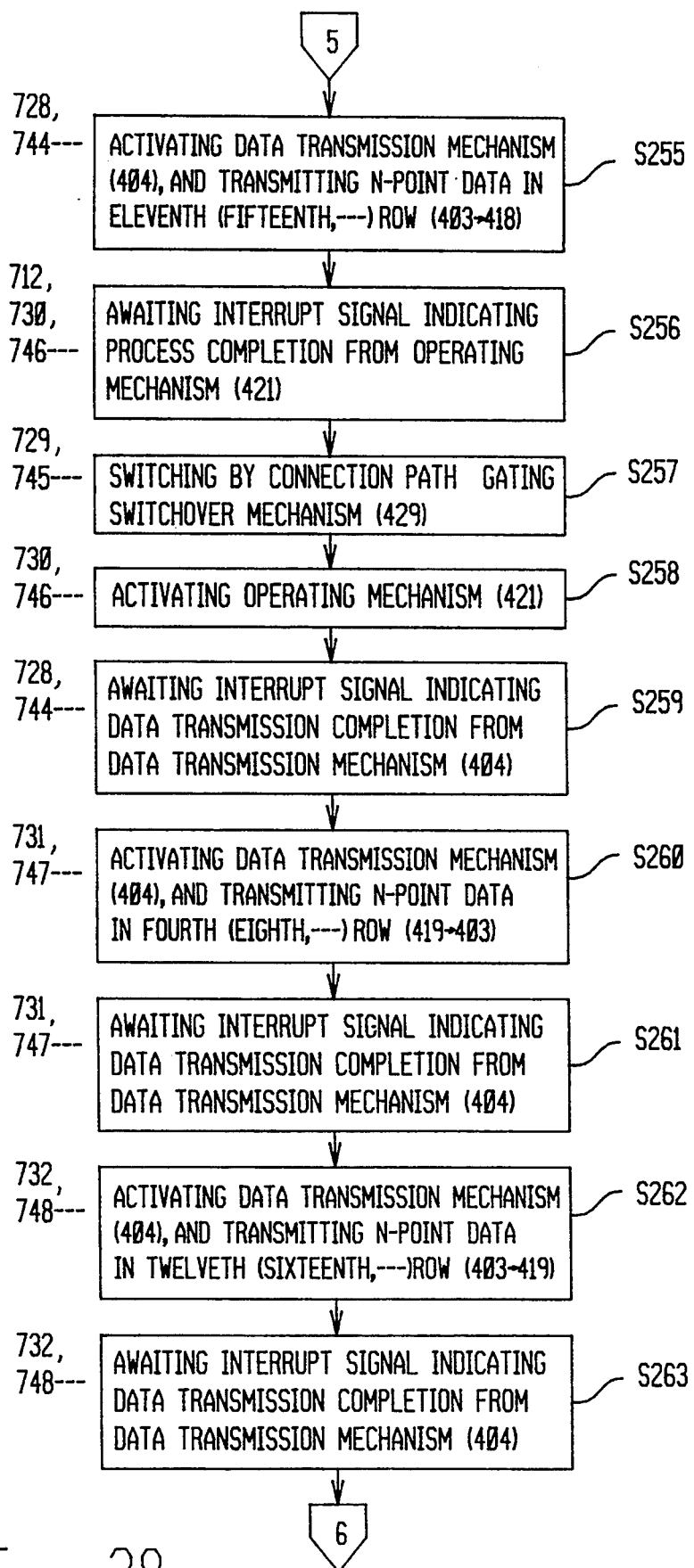
Figure 29:
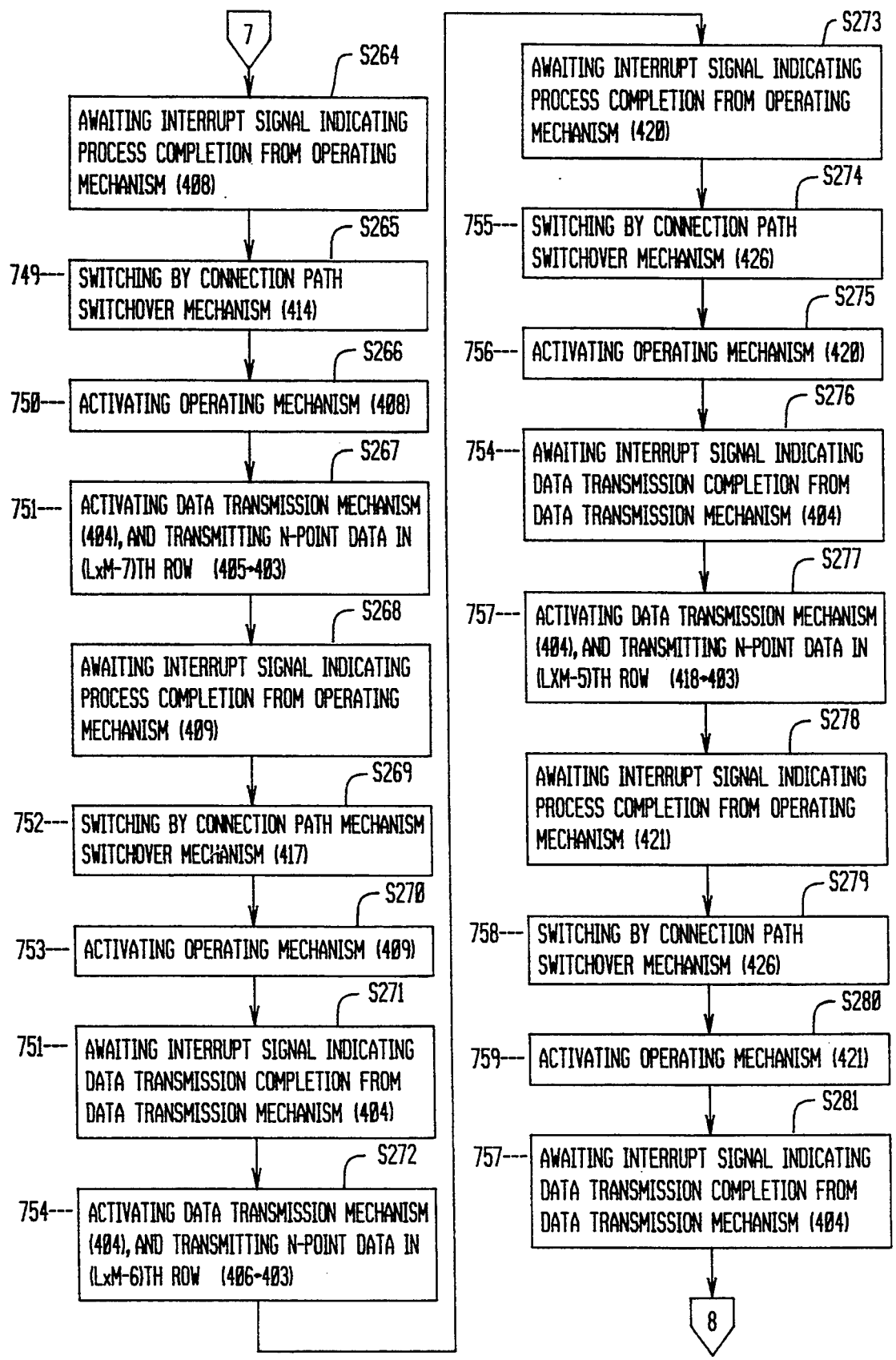
Figure 30:
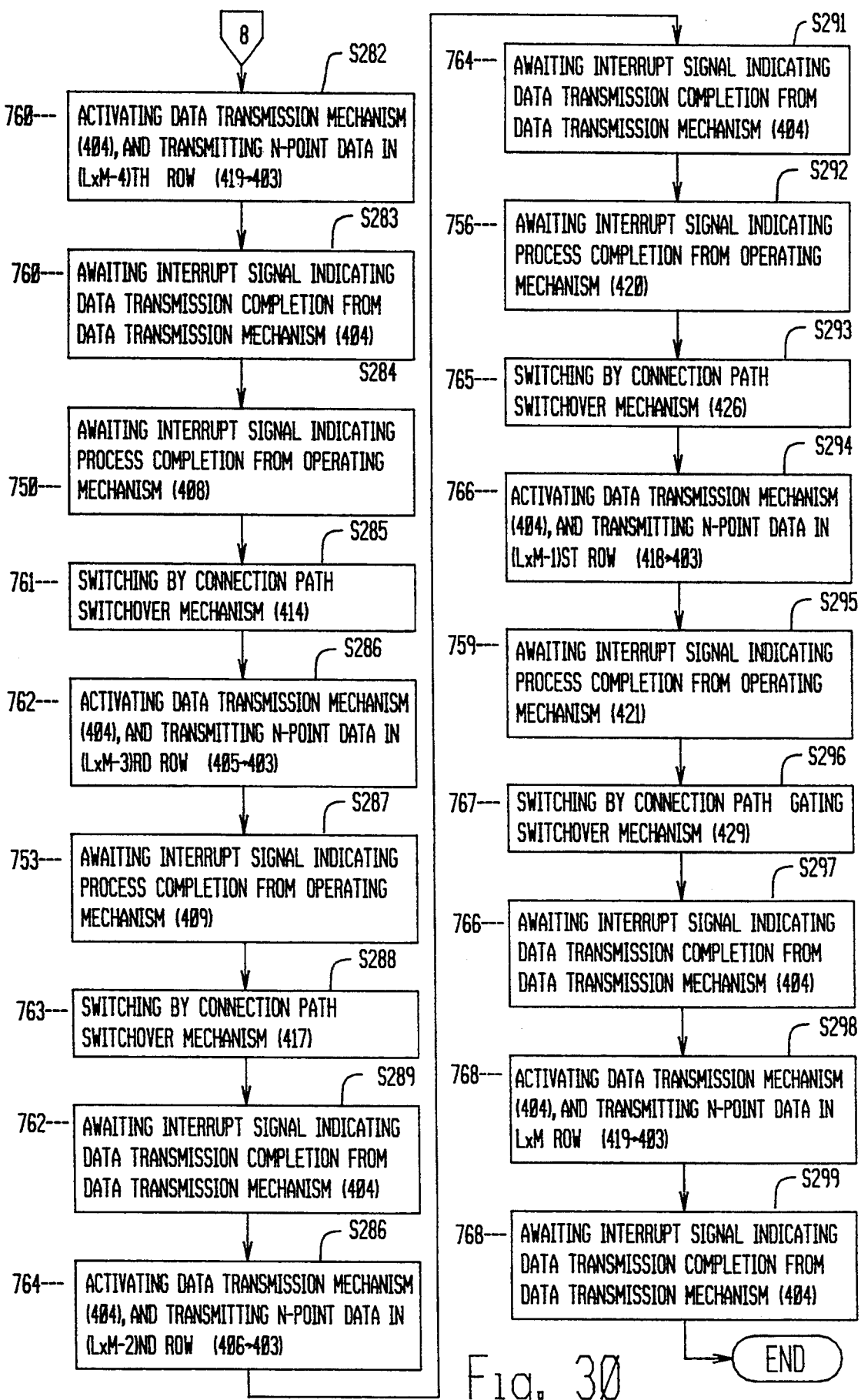

FIG. 22 shows an example of a time chart for explaining the third-dimension data process performed in N-point-data-string units.

In FIG. 22, a indicates the timing of an operation and a read/write of data in the third-dimension data processing operation performed by the first operating mechanism 408, b indicates the timing of a switchover of the connection path of the local memory banks A 412 and B 413 by the connection path switchover mechanism 414 in the first local memory mechanism 405, c indicates the timing of a data transmission by the data transmission mechanism 404 from the shared memory mechanism 403 to the first local memory mechanism 405, d indicates the timing of a data transmission by the data transmission mechanism 404 from the local memory mechanism 405 to the shared memory mechanism 403, e indicates the timing of a read/write of data to be operated and an operation result of the third-dimension data processing operation performed by the second operating mechanism 409, f indicates the timing of a switchover of the connection path of the local memory banks A 415 and B 416 by the connection path switchover mechanism 417 in the second local memory mechanism 406, g indicates the timing of a data transmission by the data transmission mechanism 404 from the shared memory mechanism 403 to the second local memory mechanism 406, h indicates the timing of a data transmission by the data transmission mechanism 404 from the second local memory mechanism 406 to the shared memory mechanism 403, i indicates the timing of a read/write of data to be operated and an operation result of the third-dimension data processing operation performed by the third operating mechanism 420, j indicates the timing of a switchover of the connection path of the local memory banks A 424 and B 425 by the connection path switchover mechanism 426 in the third local memory mechanism 418, k indicates the timing of a data transmission by the data transmission mechanism 404 from the shared memory mechanism 403 to the third local memory mechanism 418, 1 indicates the timing of a data transmission by the data transmission mechanism 404 from the third local memory mechanism 418 to the shared memory mechanism 403, m indicates the timing of a read/write of data to be operated and an operation result of the third-dimension data processing operation performed by the fourth operating mechanism 421, n indicates the timing of a switchover of the connection path of the local memory banks A 427 and B 428 by the connection path switchover mechanism 429 in the fourth local memory mechanism 419, o indicates the timing of a data transmission by the data transmission mechanism 404 from the shared memory mechanism 403 to the fourth local memory mechanism 419, and p indicates the timing of a data transmission by the data transmission mechanism 404 from the fourth local memory mechanism 419 to the shared memory mechanism 403.

At the timing 701 shown in FIG. 18, the data in the first column are transmitted from the shared memory mechanism 403 to the local memory bank A 412 in the local memory mechanism 405 connected to the first operating mechanism 408 shown in FIG. 17. Then, the connection path switchover mechanism 414 in the local memory mechanism 405 is set such that the local memory bank A 412 is connected to the shared memory mechanism 403, and the local memory bank B 413 is connected to the first operating mechanism 408. After all the data are transmitted, the connection path switchover mechanism 414 in the local memory mechanism 405 starts its operation (at the timing 702), and the local memory bank A 412 is connected to the first operating mechanism 408 to start the third-dimension data processing operation (at the timing 703) performed on the data in the first column.

Since the data transmission mechanism 404 is released at the same timing, the data in the second column are transmitted (at the timing 704) to the local memory bank A 415 in the local memory mechanism 406 connected to the second operating mechanism 409, the connection path switchover mechanism 417 in the local memory mechanism 406 is operated (at the timing 705), and the second operating mechanism 409 performs the third-dimension data processing operation on the data in the second column (at the timing 706).

Likewise, the data are transmitted to the third and the fourth local memory mechanisms 418 and 419, the connection path switchover mechanisms 426 and 429 are operated, and the operating mechanism 420 and 421 are sequentially activated (at the timing 707 and 712) for the data in the third and fourth columns respectively.

With this configuration, the memory banks B 413, 416, 425, and 428 in the local memory mechanisms 405, 406, 418, and 419 are connected to the local bus 407. The data transmission mechanism 404 sequentially transmits (at the timing 713–716) the data in the fifth, sixth, seventh, and eighth columns for the following data processes from the shared memory mechanism 403 to the memory banks B 413, 416, 425, and 428 in the local memory mechanisms 405, 406, 418, and 419. When the third-dimension data processing operation is performed (at the timing 703) on the data in the first column, the connection path switchover mechanism 414 in the local memory mechanism 405 is operated again (at the timing 717). Then, the local memory bank B 413 is connected to the first operating mechanism 408, and the third-dimension data processing operation is performed (at the timing 718) on the data in the fifth column stored in local memory bank B 413 at the timing 713. Simultaneously, the data in the first column which have already passed through the operation and accumulated in the local memory bank A 412 in the local memory mechanism 405 are transmitted by the data transmission mechanism 404 to the shared memory mechanism 403 (at the timing 719). Then, the data in the ninth column are transmitted from the shared memory mechanism 403 to the local memory bank A 412 in the local memory mechanism 405 (at the timing 720).

Likewise, the data in the sixth, seventh and eighth columns are operated upon, in the second, third, and fourth operating mechanisms 409, 420, and 421, and the local memory mechanisms 406, 418, and 419, and the data in the second, third, and fourth columns are transmitted, and the data in the tenth, the eleventh, and the twelfth columns are stored for use (at the timing 721–732).

As described above, the operations are performed by the four operating mechanisms 408, 409, 420, and 421. Concurrently, the data are transmitted between the shared memory mechanism 403 and the local memory mechanisms 405, 406, 418, and 419. Thus, the third-dimension data processing operations are performed on all the data (at the timings 733–768 in FIG. 22 and in S82–S84 and S9 in FIG. 18).

After the data are processed by the image constructing operation, they are temporarily stored in the shared memory mechanism 403. Then, they are collectively transmitted to the computer system bus 12 through the host interface mechanism 402 (S10 in FIG. 10) and displayed on the console 16 (or they can be sequentially displayed in the order in which they are through with the operation.)

All the operations and their timing can be controlled by the instruction control mechanism 401 as shown in FIG. 17.

The second-dimension data processing operation shown in FIG. 21 and performed by the instruction control mechanism 401 on the L×M-point data is the same as the second-dimension data processing operation in the first principle. Actually, it is absolutely the same as the second principle only if numbers are reassigned to the local memory mechanisms, the operating mechanisms, and the timing in the flowchart shown in FIG. 16. Accordingly, explanation is omitted here.

The third-dimension data processing operation performed in N-point data column units by the instruction control mechanism 401 shown in FIG. 22 is explained below by referring to the flowcharts shown in FIGS. 23–30. A number shown at the upper left corner of each frame in these flowcharts corresponds to the number written in the time chart shown in FIG. 22. As preconditions of the third-dimension process, the data already processed in the first- and second dimension data processes must be stored in the shared memory mechanism 403, and the processed data comprise L×M×N point elements.

Also in the third-dimension data process, the controlling operation by the instruction control mechanism 401 is not different in principle from the above described second-dimension data processing operation. That is, the operating mechanisms 408, 409, 420, and 421, and the connection path switchover mechanisms 414, 417, 426, and 429, and the data transmission mechanism 404 start their operations according to the activation signal issued by the instruction control mechanism 401. On completing each of their operations, they output an operation completion signal to the instruction control mechanism 401. In response to the operation completion signal, the instruction control mechanism 401 outputs an activation signal to each of the above described mechanisms and control such that operations are performed in order. Therefore, the third-dimension data processing operation is explained briefly as follows by referring to the flowcharts shown in FIGS. 23–30.

First, at the initialization in step S 211, the instruction control mechanism 401 initializes the connection path switchover mechanisms 414, 417, 426, and 429. That is, the local banks A 412, A 415, A 424, and A 427 are connected to the local bus 407, and the local memory banks B 413, B 416, B 425, and B 428 are connected to the operating mechanisms 408, 409, 420, and 421 respectively.

Next, in step S 212, the data transmission mechanism 404 is activated and the N-point data in the first column are transmitted from the shared memory mechanism 403 to the local memory mechanism 405.

Then, in step S 213, the input of an interrupt signal indicating the completion of a data transmission is awaited.

In step S 214, the connection path switchover mechanism 414 switches the setting of the connection path. Thus, the local memory bank A 412 is connected to the operating mechanism 408, and the local memory bank B 413 is connected to the local bus 407.

Then, in step 215, the operating mechanism 408 is activated and starts its operation.

In step S 216, the data transmission mechanism 404 is activated and the N-point data in the second column are transmitted from the shared memory mechanism 403 to the local memory mechanism 406.

In step S 217, the input from the data transmission mechanism 404 of an interrupt signal indicating the completion of a data transmission is awaited.

In step S 218, the connection path switchover mechanism 417 switches the setting of the connection path. Thus, the local memory bank A 415 is connected to the operating mechanism 409, and the local memory bank B 416 is connected to the local bus 407.

Next, in step S 219, the operating mechanism 409 is activated and starts its operation.

In step S 220, the data transmission mechanism 404 is activated and the N-point data in the third column are transmitted from the shared memory mechanism 403 to the local memory mechanism 418.

In step S 221, the input from the data transmission mechanism 404 of an interrupt signal indicating the completion of a data transmission is awaited.

In step S 222, the connection path switchover mechanism 426 switches the setting of the connection path. Thus, the local memory bank A 424 is connected to the operating mechanism 420, and the local memory bank B 425 is connected to the local bus 407.

Next, in step S 223, the operating mechanism 420 is activated and starts its operation.

In step S 224, the data transmission mechanism 404 is activated and the N-point data in the fourth column are transmitted from the shared memory mechanism 403 to the local memory mechanism 419.

In step S 225, the input from the data transmission mechanism 404 of an interrupt signal indicating the completion of a data transmission is awaited.

In step S 226, the connection path switchover mechanism 429 switches the setting of the connection path. Thus, the local memory bank A 427 is connected to the operating mechanism 421, and the local memory bank B 428 is connected to the local bus 407.

Next, in step S 227, the operating mechanism 421 is activated and starts its operation.

In step S 228, the data transmission mechanism 404 is activated and the N-point data in the fifth column are transmitted from the shared memory mechanism 403 to the local memory mechanism 405.

In step S 229, the input from the data transmission mechanism 404 of an interrupt signal indicating the completion of a data transmission is awaited.

In step S 230, the data transmission mechanism 404 is activated and the N-point data in the sixth column are transmitted from the shared memory mechanism 403 to the local memory mechanism 406.

Next, in step S 231, the input from the data transmission mechanism 404 of an interrupt signal indicating the completion of a data transmission is awaited.

In step S 232, the data transmission mechanism 404 is activated and the N-point data in the seventh column are transmitted from the shared memory mechanism 403 to the local memory mechanism 418.

In step S 233, the input from the data transmission mechanism 404 of an interrupt signal indicating the completion of a data transmission is awaited.

In step S 234, the data transmission mechanism 404 is activated and the N-point data in the eighth column are transmitted from the shared memory mechanism 403 to the local memory mechanism 419.

Next, in step S 235, the input from the data transmission mechanism 404 of an interrupt signal indicating the completion of a data transmission is awaited.

In step S 236, determination is made as to whether or not the process has been repeated (L×M/4−2) times. If no (No in step S 236), control is transferred to step S 237.

In step S 237, the input from the operating mechanism 408 of an interrupt signal indicating the completion of a process is awaited.

In step S 238, the connection path switchover mechanism 414 switches the setting of the connection path.

In step S 239, the operating mechanism 408 is activated and starts its operation.

In step S 240, the data transmission mechanism 404 is activated and the N-point data in the first (fifth, - - -) column are transmitted from the local memory mechanism 405 to the shared memory mechanism 403 after processed in operations.

In step S 241, the input from the data transmission mechanism 404 of an interrupt signal indicating the completion of a data transmission is awaited.

In step S 242, the data transmission mechanism 404 is activated and the N-point data in the ninth (thirteenth, - - -) column are transmitted from the shared memory mechanism 403 to the local memory mechanism 405.

In step S 243, the input from the operating mechanism 409 of an interrupt signal indicating the completion of a process is awaited.

In step S 244, the connection path switchover mechanism 417 switches the setting of the connection path.

In step S 245, the operating mechanism 409 is activated and starts its operation.

Next, in step S 246, the input from the data transmission mechanism 404 of an interrupt signal indicating the completion of a data transmission is awaited.

In step S 247, the data transmission mechanism 404 is activated and the N-point data in the second (sixth, - - -) column are transmitted from the local memory mechanism 406 to the shared memory mechanism 403 after processed in operations.

In step S 248, the input from the data transmission mechanism 404 of an interrupt signal indicating the completion of a data transmission is awaited.

In step S 249, the data transmission mechanism 404 is activated and the N-point data in the tenth (fourteenth, - - -) column are transmitted from the shared memory mechanism 403 to the local memory mechanism 406.

In step S 250, the input from the operating mechanism 420 of an interrupt signal indicating the completion of a process is awaited.

In step S 251, the connection path switchover mechanism 426 switches the setting of the connection path.

In step S 252, the operating mechanism 420 is activated and starts its operation.

In step S 253, the input from the data transmission mechanism 404 of an interrupt signal indicating the completion of a data transmission is awaited.

In step S 254, the data transmission mechanism 404 is activated and the N-point data in the third (seventh, - - -) column are transmitted from the local memory mechanism 418 to the shared memory mechanism after processed in operations.

In step S 255, the data transmission mechanism 404 is activated and the N-point data in the eleventh (fifteenth, - - -) column are transmitted from the shared memory mechanism 403 to the local memory mechanism 418.

In step S 256, the input from the operating mechanism 421 of an interrupt signal indicating the completion of a process is awaited.

In step S 257, the connection path switchover mechanism 429 switches the setting of the connection path.

Next, in step S 258, the operating mechanism 421 is activated and starts its operation.

In step S 259, the input from the data transmission mechanism 404 of an interrupt signal indicating the completion of a data transmission is awaited.

In step S 260, the data transmission mechanism 404 is activated and the N-point data in the fourth (eighth, - - -) column are transmitted from the local memory mechanism 419 to the shared memory mechanism 403 after processed in operations.

In step S 261, the input from the data transmission mechanism 404 of an interrupt signal indicating the completion of a data transmission is awaited.

Next, in step S 262, the data transmission mechanism 404 is activated and the N-point data in the twelfth (sixteenth, - - -) column are transmitted from the shared memory mechanism 403 to the local memory mechanism 409.

In step S 263, the input from the data transmission mechanism 404 of an interrupt signal indicating the completion of a data transmission is awaited.

Then, control is transferred to step S 236. Determination is made as to whether or not the process has been repeated ($L \times M/4 - 2$) times. If no (No in step S 236), control is transferred to step S 237, and step S 238 and the following steps are carried out.

If, in step S 236, it is determined that the process has already been repeated ($L \times M/4 - 2$) times (Yes in step S 236), control is transferred to the next step 264.

In step S 264, the input from the operating mechanism 408 of an interrupt signal indicating the completion of a process is awaited.

In step S 265, the connection path switchover mechanism 414 switches the setting of the connection path.

In step S 266, the operating mechanism 408 is activated and starts its operation.

In step S 267, the data transmission mechanism 404 is activated and the N-point data in the ($L \times M - 7$)th column are transmitted from the local memory mechanism 405 to the shared memory mechanism 403 after processed in operations.

In step S 268, the input from the operating mechanism 409 of an interrupt signal indicating the completion of a process is awaited.

In step S 269, the connection path switchover mechanism 417 switches the setting of the connection path.

In step S 270, the operating mechanism 409 is activated and starts its operation.

In step S 271, the input from the data transmission mechanism 404 of an interrupt signal indicating the completion of a data transmission is awaited.

In step S 272, the data transmission mechanism 404 is activated and the N-point data in the ($L \times M - 6$)th column are transmitted from the local memory mechanism 406 to the shared memory mechanism 403 after processed in operations.

Then, in step S 273, the input from the operating mechanism 420 of an interrupt signal indicating the completion of a process is awaited.

In step S 274, the connection path switchover mechanism 426 switches the setting of the connection path.

In step S 275, the operating mechanism 420 is activated and starts its operation.

In step S 276, the input from the data transmission mechanism 404 of an interrupt signal indicating the completion of a data transmission is awaited.

In step S 277, the data transmission mechanism 404 is activated and the N-point data in the ($L \times M - 5$)th column are transmitted from the local memory mechanism 418 to the shared memory mechanism 403 after processed in operations.

In step S 278, the input from the operating mechanism 421 of an interrupt signal indicating the completion of a process is awaited.

In step S 279, the connection path switchover mechanism 426 switches the setting of the connection path.

In step S 280, the operating mechanism 421 is activated and starts its operation.

Next, in step S 281, the input from the data transmission mechanism 404 of an interrupt signal indicating the completion of a data transmission is awaited.

In step S 282, the data transmission mechanism 404 is activated and the N-point data in the $(L \times M - 4)$th column are transmitted from the local memory mechanism 419 to the shared memory mechanism 403 after processed in operations.

In step S 283, the input from the data transmission mechanism 404 of an interrupt signal indicating the completion of a data transmission is awaited.

In step S 284, the input from the operating mechanism 408 of an interrupt signal indicating the completion of a process is awaited.

In step S 285, the connection path switchover mechanism 414 switches the setting of the connection path.

In step S 286, the data transmission mechanism 404 is activated and the N-point data in the $(L \times M - 3)$th column are transmitted from the local memory mechanism 405 to the shared memory mechanism 403 after processed in operations.

In step S 287, the input from the operating mechanism 409 of an interrupt signal indicating the completion of a process is awaited.

In step S 288, the connection path switchover mechanism 417 switches the setting of the connection path.

In step S 289, the input from the data transmission mechanism 404 of an interrupt signal indicating the completion of a data transmission is awaited.

In step S 290, the data transmission mechanism 404 is activated and the N-point data in the $(L \times M - 2)$th column are transmitted from the local memory mechanism 406 to the shared memory mechanism 403 after processed in operations.

In step S 291, the input from the data transmission mechanism 404 of an interrupt signal indicating the completion of a data transmission is awaited.

In step S 292, the input from the operating mechanism 420 of an interrupt signal indicating the completion of a process is awaited.

In step S 293, the connection path switchover mechanism 426 switches the setting of the connection path.

In step S 294, the data transmission mechanism is activated and the N-point data in the $(L \times M - 1)$th column are transmitted from the local memory mechanism 418 to the shared memory mechanism 403 after processed in operations.

In step S 295, the input from the operating mechanism 421 of an interrupt signal indicating the completion of a process is awaited.

In step S 296, the connection path switchover mechanism 429 switches the setting of the connection path.

In step S 297, the input from the data transmission mechanism 404 of an interrupt signal indicating the completion of a data transmission is awaited.

In step S 298, the data transmission mechanism 404 is activated and the N-point data in the $(L \times M)$th column are transmitted from the local memory mechanism to the shared memory mechanism 403 after processed in operations. In step S 299, the input from the data transmission mechanism 404 of an interrupt signal indicating the completion of a data transmission is awaited.

Thus, the three-dimensional data process is completed.

As described above, in the first and the second principles, the image construct operating system can comprise at least two or four sets of an operating mechanism, a connection path switchover mechanism, and a local memory mechanism having two memory banks. With this configuration, these embodiments take only $\frac{1}{2}$ of the time (when two sets are mounted) or $\frac{1}{4}$ of the time (when four sets are mounted) in performing an image construct operation process executed in the two-or three-dimensional Fourier transformation method.

The processing time can be shortened further by providing a larger number of sets of these operating mechanisms and local memory mechanisms.

What is claimed is:

1. An image construct operating unit for a nuclear magnetic resonance imaging system for performing an image constructing operation using a two-dimensional Fourier transformation method in which a first-dimension data process is executed immediately after a first data collection or in parallel with any following data collection, and a second-dimension data process is performed after collection of all measurement data and after the first-dimension transformation is completed for all data, said unit comprising:

a plurality of operating mechanism means for performing operations to construct an image, a plurality of sets of corresponding local memory mechanism means corresponding to said operating mechanism means for storing data used in said operation and for storing operation results, shared memory mechanism means for storing data for which transformation is complete after execution of said first and second-dimension processes, data transmission mechanism means for transmitting data between said local memory mechanism means for said shared memory mechanism means, and instruction control mechanism means for controlling each of said operating mechanisms and its timing, said instruction control mechanism means enabling operations performed by said plurality of operating mechanism means in said first- and second-dimension data processes to be carried out concurrently, and enabling each operation performed by said operating mechanism means in first- and second-dimension data processes to be carried out in parallel with the data transmission between said local memory mechanism means and said shared memory mechanism means.

2. An image construct operating unit for a nuclear magnetic resonance imaging system according to claim 1, wherein at least 2 sets of corresponding operating mechanism means and local memory mechanism means are provided.

3. An image construct operating unit for a nuclear magnetic resonance imaging system according to claim 2, wherein in each of the first-dimension and second-dimension data processes, one of said operating mechanism means accesses the corresponding local memory mechanism means to read/write data during operation.

4. An image construct operating unit for a nuclear magnetic resonance imaging system according to claim 1, wherein in each of the first-dimension and second-dimension data processes, one of said operating mechanism means accesses the corresponding local memory mechanism means to read/write data during operation.

5. An image construct operating unit for a nuclear magnetic resonance imaging system for performing an image constructing operation using a two-dimensional Fourier transformation method in which a first-dimensional data process is executed immediately after a first data collection or in parallel with any following data collection, and a second-dimension data process is performed after collection of all measurement data and after the first-dimension transformation is completed for all data, said unit comprising:

a plurality of operating mechanism means for performing operations to construct an image, a plurality of sets of corresponding local memory mechanism means corresponding to said operating mechanism means for storing data used in said operation and for storing operation results, shared memory mechanism means for storing data for which transformation is complete after execution of said first and second-dimension processes, data transmission mechanism means for transmitting data between said local memory mechanism means for said shared memory mechanism means, and instruction control mechanism means for controlling each of said operating mechanisms and its timing, said instruction control mechanism means in said first- and second-dimension data processes enabling each operation performed by said operating mechanism means in first- and second-dimension data processes to be carried out in parallel with the data transmission between said local memory mechanism means and said shared memory mechanism means, wherein, said local memory mechanism means comprises halved local memory banks and a connection path switchover mechanism means for switching to and from the connection path between said local memory banks and said operating mechanism means and the connection path between said local memory banks and said shared memory mechanism means, and said connection paths are switched over by said connection path switchover mechanism means as necessary to concurrently perform a read/write of data by said operating mechanism means and a read/write of data by said data transmission mechanism means.

6. An image construct operating unit for a nuclear magnetic resonance imaging system according to claim 5, wherein said switchover by said connection path switchover mechanism means to and from the connection between said halved local memory banks and said operating mechanism means and to the connection between said halved local memory banks and said shared memory mechanism means is carried out, after one operation by said operating mechanism means is completed, one halved local memory bank currently connected to said operating mechanism means is connected to said shared memory mechanism means and the other halved local memory bank currently connected to said shared memory mechanism means is connected to said operating mechanism means.

7. An image construct operating unit for a nuclear magnetic resonance imaging system according to claim 6, wherein a read/write of data between one halved local memory bank and said shared memory mechanism means connected to it is performed by said data transmission mechanism means while a read/write of data stored in the other halved local memory bank connected to said operating mechanism means is performed by said operating mechanism means.

8. An image construct operating unit for a nuclear magnetic resonance imaging system for performing an image constructing operation using a three-dimensional Fourier transformation method in which a first-dimension data process is executed immediately after a first data collection or in parallel with any following data collection, a second-dimension data process is executed immediately after a predetermined number of repetitions of data collections or in parallel with the measurement data collection, and first- and second data processes are performed in parallel, and a third data process is executed after the first- and second-dimensional transformation is completed for all data, said unit comprising:

a plurality of operating mechanism means for performing operations to construct an image, a plurality of sets of corresponding local memory mechanism means corresponding to said operating mechanism means for storing data used in said operations and for storing operation results, shared memory mechanism means for storing data for which transformation is complete after execution of said first- and second- and third-dimensional processes, data transmission mechanism means for transmitting data between said local memory mechanism and said shared memory mechanism means, and an instruction control mechanism for controlling the operation of each of said mechanism and its timing, said instruction control mechanism means enabling operations performed by said plurality of operating mechanism means in said first-, second- and third-dimension data processes to be carried out concurrently, and enabling each operation performed by said operating mechanisms means in said first-, second-, and third dimension data processes to be carried out in parallel with the data transmission between said local memory mechanism and said shared memory mechanism means.

9. An image construct operating unit for a nuclear magnetic resonance imaging system according to claim 8, wherein at least 4 sets of corresponding operating mechanism means and local memory mechanism means are provided.

10. An image construct operating unit for a nuclear magnetic resonance imaging system according to claim 9, wherein in each of the first-dimension, second-dimension, and third-dimension data processes, one of said operating mechanism means accesses the corresponding local memory mechanism means to read/write data during operation.

11. An image construct operating unit for a nuclear magnetic resonance imaging system according to claim 8, wherein in each of the first-dimension, second-dimension, and third-dimension data processes, one of said operating mechanism means accesses only the corresponding local memory mechanism means to read/write data during operation.

12. An image construct operating unit for a nuclear magnetic resonance imaging system for performing an image constructing operation using a three-dimensional Fourier transformation method in which a first-dimension data process is executed immediately after a first data collection or in parallel with any following data collection, a second-dimension data process is executed immediately after a predetermined number of repetitions of data collections or in parallel with the measurement data collection, and first- and second data processes are performed in parallel, and a third data process is executed after the first- and second-dimensional transformation is completed for all data, said unit comprising:

a plurality of operating mechanism means for performing operations to construct an image, a plurality of sets of corresponding local memory mechanism means corresponding to said operating mechanism means for storing data used in said operations and for storing operation results, shared memory mechanism means for storing data for which transformation is complete after execution of said first- and second- and third-dimensional processes, data transmission mechanism means for transmitting data between said local memory mechanism and said shared memory mechanism means, and an instruction control mechanism for controlling the operation of each of said mechanism and its timing, said instruction control mechanism means enabling each operation performed by said operating mechanisms means in said first-, second-, and third dimension data processes to be carried out in parallel with the data transmission between said local memory mechanism and said shared memory mechanism means wherein said local memory mechanism means comprises a pair of halved local memory banks and a connection path switchover mechanism means for switching to the connection path between said local memory banks and said operating mechanism means or to the connection path between said local memory banks and said shared memory mechanism means, and said connection paths are switched over by said connection path switchover mechanism means as necessary to concurrently perform a read/write of data by said operating mechanism means and a read/write of data by said data transmission mechanism means.

13. An image construct operating unit for a nuclear magnetic resonance imaging system according to claim 12, wherein said switchover by said connection path switchover mechanism means to and from the connection between said halved local memory banks and said operating mechanism means and to the connection between said halved local memory banks and said shared memory mechanism means is carried out after one operation by said operating mechanism means is completed, one halved local memory bank currently connected to said operating mechanism means is connected to said shared memory mechanism means and the other halved local memory bank currently connected to said shared memory mechanism means is connected to said operating mechanism means.

14. An image construct operating unit for a nuclear magnetic resonance imaging system according to claim 13, wherein a read/write of data between one halved local memory bank and said shared memory mechanism means connected to it is performed by said data transmission mechanism means while a read/write of data stored in the other halved local memory bank connected to said operating mechanism means is performed by said operating mechanism means.

\* \* \* \* \*